(12) United States Patent
Pan et al.

(10) Patent No.: US 11,855,201 B2
(45) Date of Patent: Dec. 26, 2023

(54) SEMICONDUCTOR STRUCTURE

(71) Applicant: TAIWAN SEMICONDUCTOR MANUFACTURING CO., LTD., Hsinchu (TW)

(72) Inventors: Chia-Ming Pan, Tainan (TW); Chia-Ta Hsieh, Tainan (TW); Po-Wei Liu, Tainan (TW); Yun-Chi Wu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/952,940

(22) Filed: Sep. 26, 2022

(65) Prior Publication Data

US 2023/0019614 A1    Jan. 19, 2023

Related U.S. Application Data

(62) Division of application No. 16/727,494, filed on Dec. 26, 2019, now Pat. No. 11,462,639.

(51) Int. Cl.
*H01L 29/78* (2006.01)
*H01L 29/66* (2006.01)

(52) U.S. Cl.
CPC .... *H01L 29/7816* (2013.01); *H01L 29/66681* (2013.01)

(58) Field of Classification Search
CPC ........... H01L 29/7816; H01L 29/66681; H01L 29/1087; H01L 29/0653; H01L 29/4238; H01L 29/7824
See application file for complete search history.

(56) References Cited

U.S. PATENT DOCUMENTS

| | | | |
|---|---|---|---|
| 7,772,673 B1 | 8/2010 | Yin et al. | |
| 2003/0168712 A1* | 9/2003 | Shin | H01L 29/66712 257/E21.418 |
| 2011/0042777 A1 | 2/2011 | Jhang et al. | |
| 2011/0309442 A1* | 12/2011 | Grote | H01L 29/7816 438/286 |
| 2019/0259829 A1 | 8/2019 | Mun et al. | |
| 2020/0075393 A1* | 3/2020 | Mehrotra | H01L 21/266 |

\* cited by examiner

*Primary Examiner* — Mohammed R Alam
(74) *Attorney, Agent, or Firm* — Birch, Stewart, Kolasch & Birch, LLP

(57) ABSTRACT

A semiconductor structure includes a semiconductor substrate, a transistor, a plurality of isolation structures, and a conductive feature. The transistor is over the semiconductor substrate. The isolation structures are over the semiconductor substrate. The isolation structures define a semiconductor ring of the semiconductor substrate surrounding the transistor. The conductive feature extends vertically in the semiconductor substrate and surrounds the transistor and semiconductor ring. The conductive feature has a rounded corner facing the semiconductor ring from a top view.

20 Claims, 27 Drawing Sheets

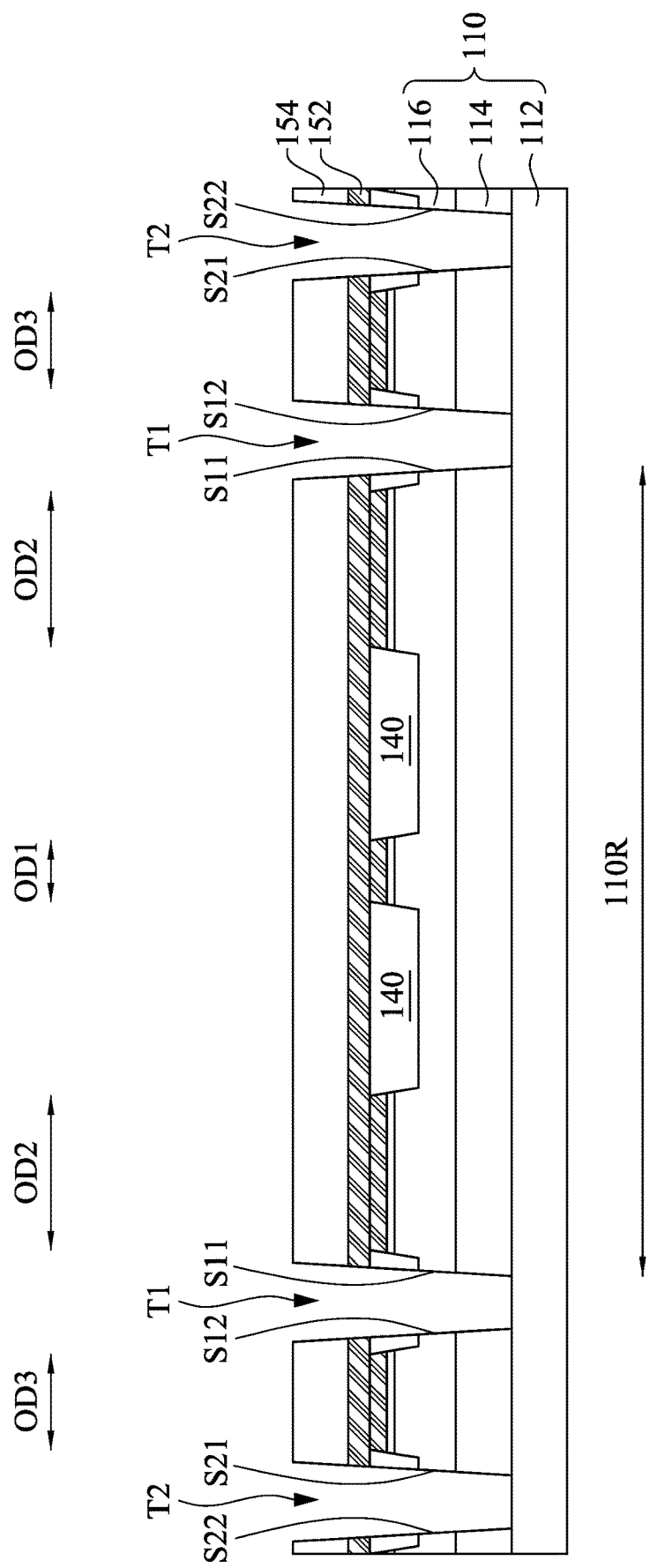

SEMICONDUCTOR STRUCTURE

PRIORITY CLAIM AND CROSS-REFERENCE

This application is a divisional application of U.S. patent application Ser. No. 16/727,494, filed Dec. 26, 2019, now U.S. Pat. No. 11,462,639, issued on Oct. 4, 2022, the entirety of which is incorporated by reference herein in its entirety.

BACKGROUND

Power metal-oxide-semiconductor field-effect transistors (MOSFETs) are MOSFETs designed to handle significant power levels, such as high voltages and/or high currents. Power MOSFETs find application in display drivers, power converters, motor controllers, vehicle power devices, and so on. One type of power MOSFET is a laterally-diffused metal-oxide semiconductor (LDMOS) transistor. LDMOS transistors have high gain, high power output, and high efficiency at high frequencies, such that LDMOS transistors are commonly used with microwave and radio frequency (RF) power amplifiers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
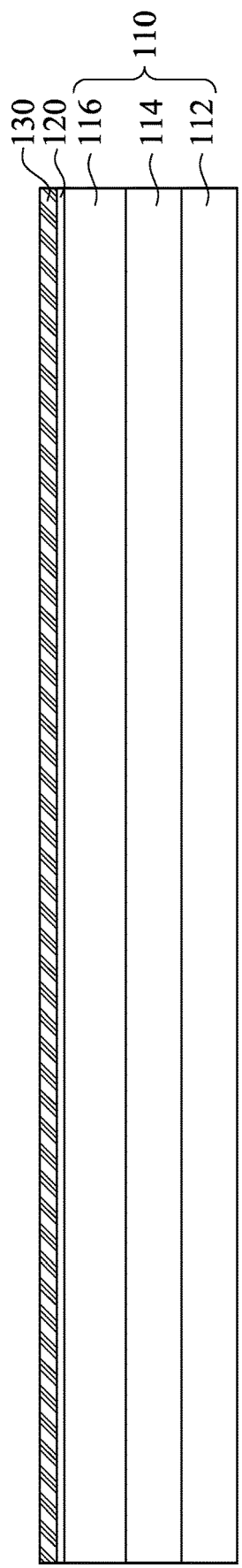
FIGS. 1-15B illustrate a top view and cross-sectional views of a method of manufacturing a semiconductor structure at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following disclosure will continue with exemplary lateral double-diffused metal oxide semiconductor (LDMOS) device fabrication to illustrate various embodiments of the present disclosure. The LDMOS device, for example, may be a n-channel LDMOS (LDNMOS) device, wherein an extended polysilicon gate is used on an extended drain field oxide to reduce surface electric fields (RESURF) and increase breakdown voltage. The LDMOS device may be formed by bipolar complementary metal oxide semiconductor (BiCMOS) process or bipolar-complementary metal oxide semiconductor (CMOS)-double diffused metal oxide semiconductor (DMOS) (BCD) process. In some embodiments, the LDMOS device may exemplarily be a Bipolar-CMOS-DMOS (BCD) device. Embodiments of the disclosure may also be applied, however, to other devices and structures.

FIGS. 1-15B illustrate a method of manufacturing a semiconductor structure at various stages in accordance with some embodiments. The illustration is merely exemplary and is not intended to be limiting beyond what is specifically recited in the claims that follow. It is understood that additional operations may be provided before, during, and after the operations shown by FIGS. 1-15B, and some of the operations described below can be replaced or eliminated for additional embodiments of the method. The order of the operations/processes may be interchangeable.

Reference is made to FIG. 1. A semiconductor substrate 110 is provided, and a pad layer 120 and a hard mask layer 130 are formed on the substrate 110. The substrate 110 may be a silicon-on-insulator (SOI) substrate including a base substrate 112, an oxide layer 114 over the substrate 112, and a semiconductor layer 116 over the oxide layer 114. The base substrate 112 may be a bulk substrate, such as bulk silicon substrate. In some embodiments, a buried oxide layer 114 may includes a thick silicon oxide layer that is grown or deposited overlying the silicon substrate 112. Other oxide materials could be used for the buried oxide layer 114. Afterwards, the semiconductor layer 116 is formed on oxide layer 104. The semiconductor layer 116 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. For example, the SOI substrates are fabricated using separation by implantation of oxygen (SIMOX), wafer bonding, and/or other suitable methods.

The pad layer 120 may be a thin film comprising silicon oxide formed using, for example, a thermal oxidation process. The pad layer 120 may act as an adhesion layer between the substrate 110 and hard mask layer 130. The pad layer 120 may also act as an etch stop layer for etching the hard mask layer 130 in subsequent process. In some embodiments, the hard mask layer 130 is formed of dielectric material, such as silicon nitride, for example, using low-pressure chemical vapor deposition (LPCVD) or plasma enhanced chemical vapor deposition (PECVD).

Figure 2:
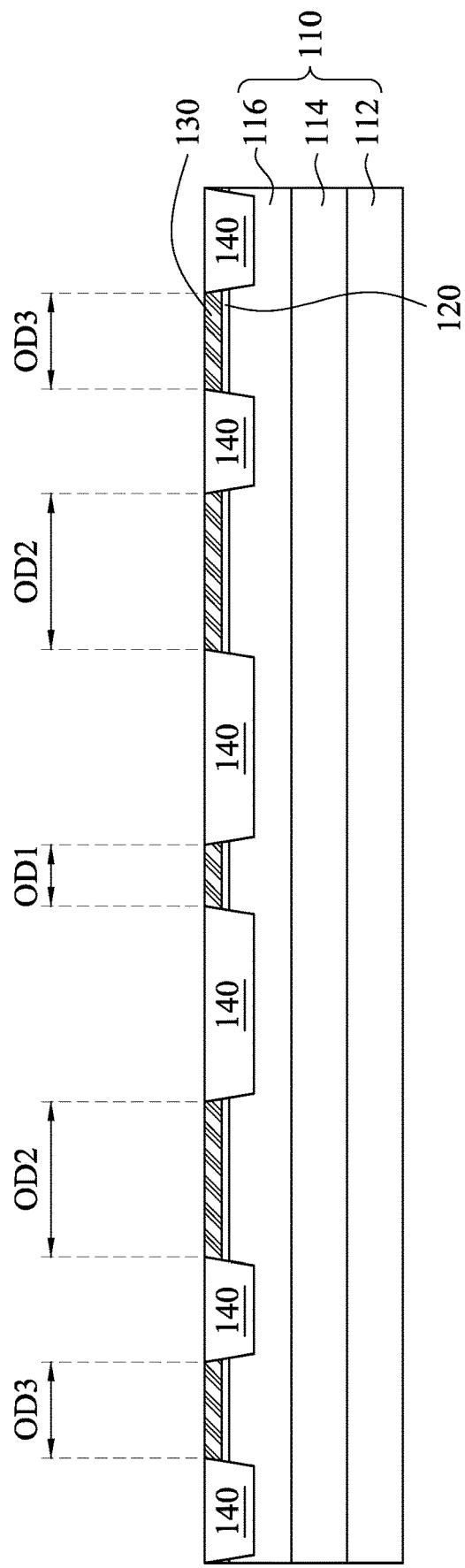

Reference is made to FIG. 2. Plural isolation structures 140 are formed in the pad layer 120, the hard mask layer 130, and the substrate 110. The isolation structures 140 may define plural regions OD1, OD2, and OD3 in the substrate 110. In some embodiments, the isolation structures 140 are made of silicon oxide, silicon nitride, silicon oxynitride, fluoride-doped silicate glass (FSG), or other low-K dielectric materials. For example, the pad layer 120, the hard mask layer 130, and the semiconductor layer 116 are patterned by suitable etching processes to form trenches therein, and a dielectric material may overfill the trenches. A chemical mechanical polish (CMP) process is then performed to remove the excess dielectric material outside the trenches and level the top surface of the dielectric material to the top surfaces of the hard mask layer 130, thereby forming the isolation structures 140. In some embodiments, the hard mask layer 130 may serve as an CMP stop layer that has a higher resistance to the CMP process than that of the dielectric material, such that the CMP process is performed until reaching a top surface of the hard mask layer 130.

Figure 3:
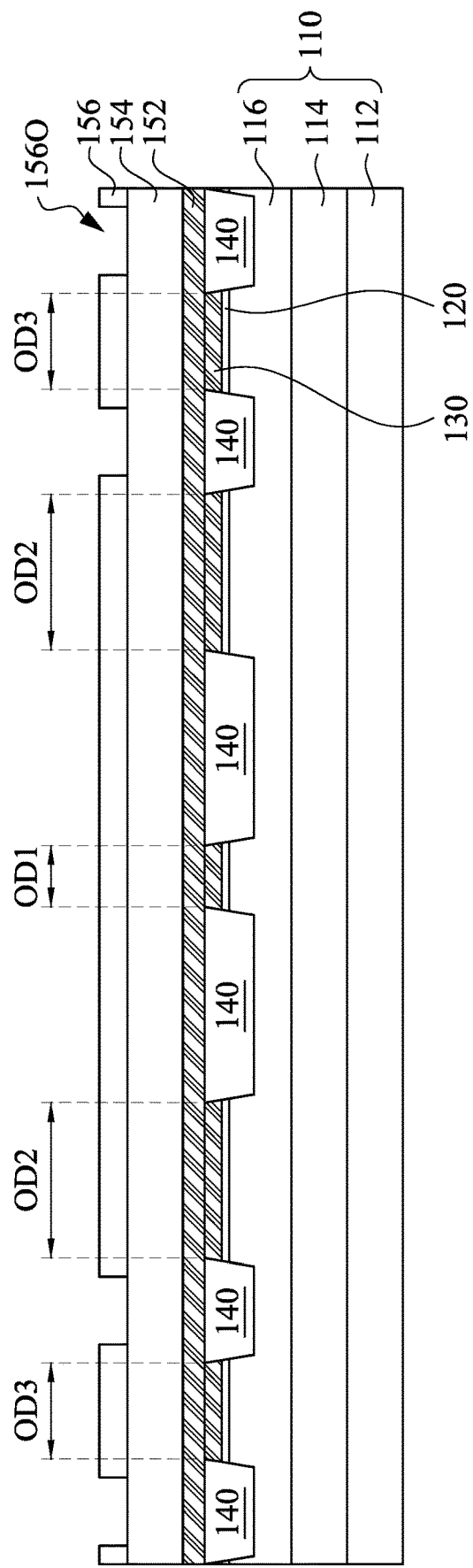

Reference is made to FIG. 3. A silicon nitride layer 152, a dielectric layer 154, and a hard mask layer 156 are formed over the isolation structures 140 and the hard mask layer 130 by suitable deposition processes. In some embodiments, the silicon nitride layer 152 is formed of dielectric material, such as silicon nitride, for example, using low-pressure chemical vapor deposition (LPCVD) or plasma enhanced chemical vapor deposition (PECVD). The silicon nitride layer 152 may serve as a CMP stop layer in subsequent process. The dielectric layer 154 may include silicon, phosphosilicate glass (PSG) boro-silicate glass (BSG), fluorinated silicon glass (FGS), low-k dielectric materials, undoped silicate glass (USG), tetraethylorthosilicate (TEOS) oxide, other inter-layer (or inter-metal) dielectric (ILD) materials, and/or other suitable materials. The hard mask layer 156 may include hard mask material. Exemplary hard mask materials include silicon oxide, silicon nitride, silicon oxynitride (SiON), silicon, titanium nitride (TiN), titanium (Ti), and/or other suitable hard mask materials.

The hard mask layer 156 is patterned to have openings 156O, in which at least a portion of the openings 156O are aligned with the underlying isolation structures 140. For example, a photoresist layer is formed on the hard mask layer 156 and then patterned by photolithography processes, forming openings in the photoresist layer, such that some regions of the hard mask layer 156 are exposed by the photoresist layer. An etching process, such as dry etching is then performed to the hard mask layer 156 using the patterned photoresist layer as an etching mask and stop on the underlying dielectric layer 154, thereby forming the openings 156O exposing the underlying dielectric layer 154 in the hard mask layer 156.

Figure 4A:
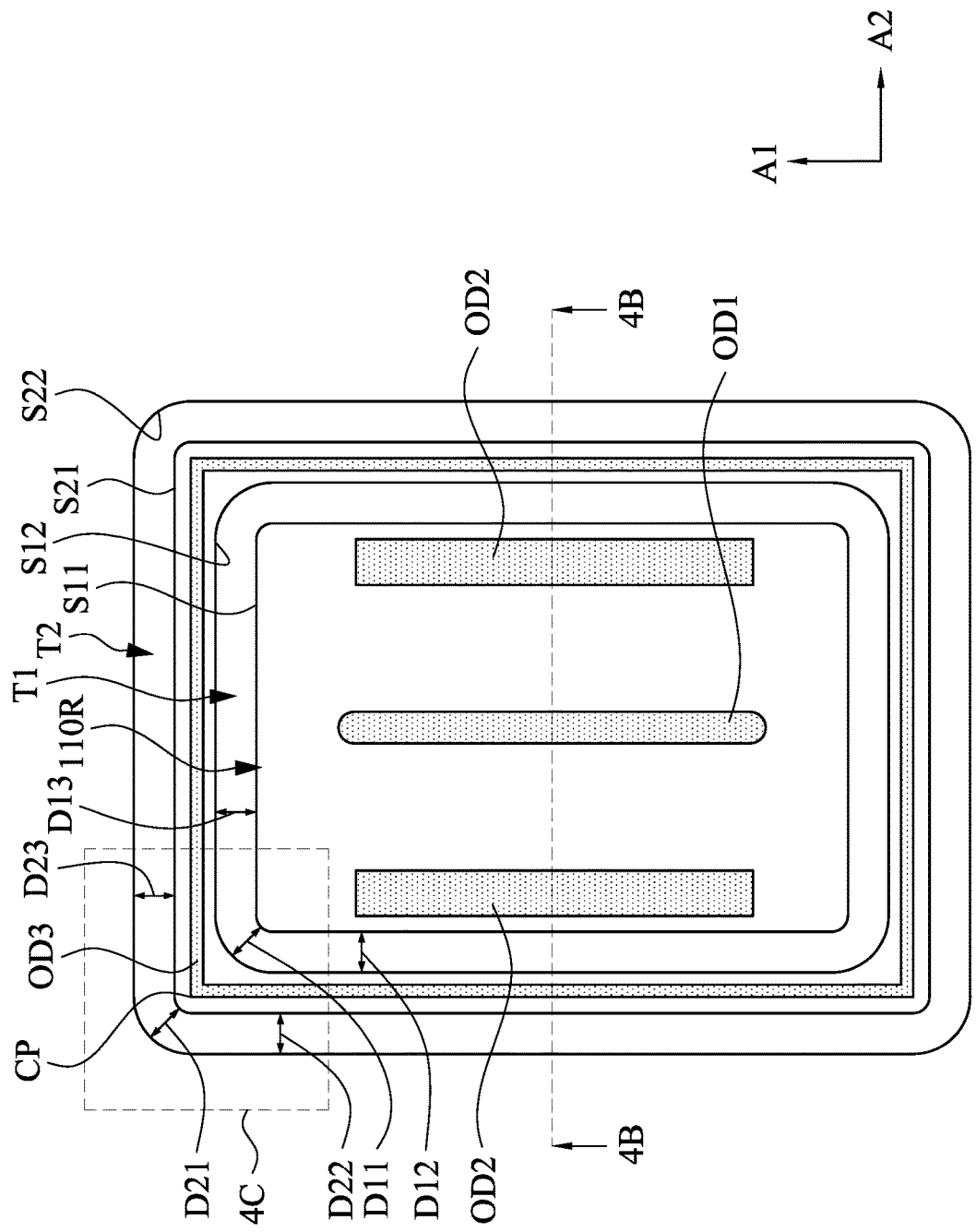

Reference is made to FIGS. 4A and 4B. FIG. 4B is a schematic cross-sectional view taken along line 4B-4B in FIG. 4A. The dielectric layer 154, the silicon nitride layer 152, the isolation structures 140, the semiconductor layer 116, and the buried oxide layer 114 are etched through the openings 156O of the hard mask layer 156 (referring to FIG. 3), thereby forming an inner trench T1 and an outer trench T2 exposing portions of the substrate 112. The inner trench T1 may surround a device region 110R of the substrate 110 where transistors are to be formed, in which the regions OD1 and OD2 are in the device region 110R of the substrate 110. The outer trench T2 surrounds the device region 110R, the region OD3, and the inner trench T1.

The formation of the trenches T1 and T2 may include one or plural etching processes. The etching process(es) may be an anisotropic dry etching process. For example, the formation of the trenches T1 and T2 may include first to third etching processes, in which the first etching process using $CF_4$ as etchants removes the dielectric layer 154, the silicon nitride layer 152, and the isolation structures 140, and the second etching process using $SF_6$ and $C_4F_8$ as etchants removes the semiconductor layer 116, and the third etching process using $CF_4$ as etchants removes the buried oxide layer 114. The hard mask layer 156 (referring to FIG. 3) may have a etch resistance to the first and third etching processes than that of the dielectric layer 154, the isolation structures 140, and the buried oxide layer 114, such that the hard mask layer 156 may act as a etch mask protecting the underlying layers from being etched in the etching processes. After the etching processes, the hard mask layer 156 (referring to FIG. 3) may be removed by suitable nitride removing process. In some embodiments, the removal of the hard mask layer 156 (referring to FIG. 3) may consume a portion of the dielectric layer 154, such that a thickness of the dielectric layer 154 is reduced.

Figure 4C:
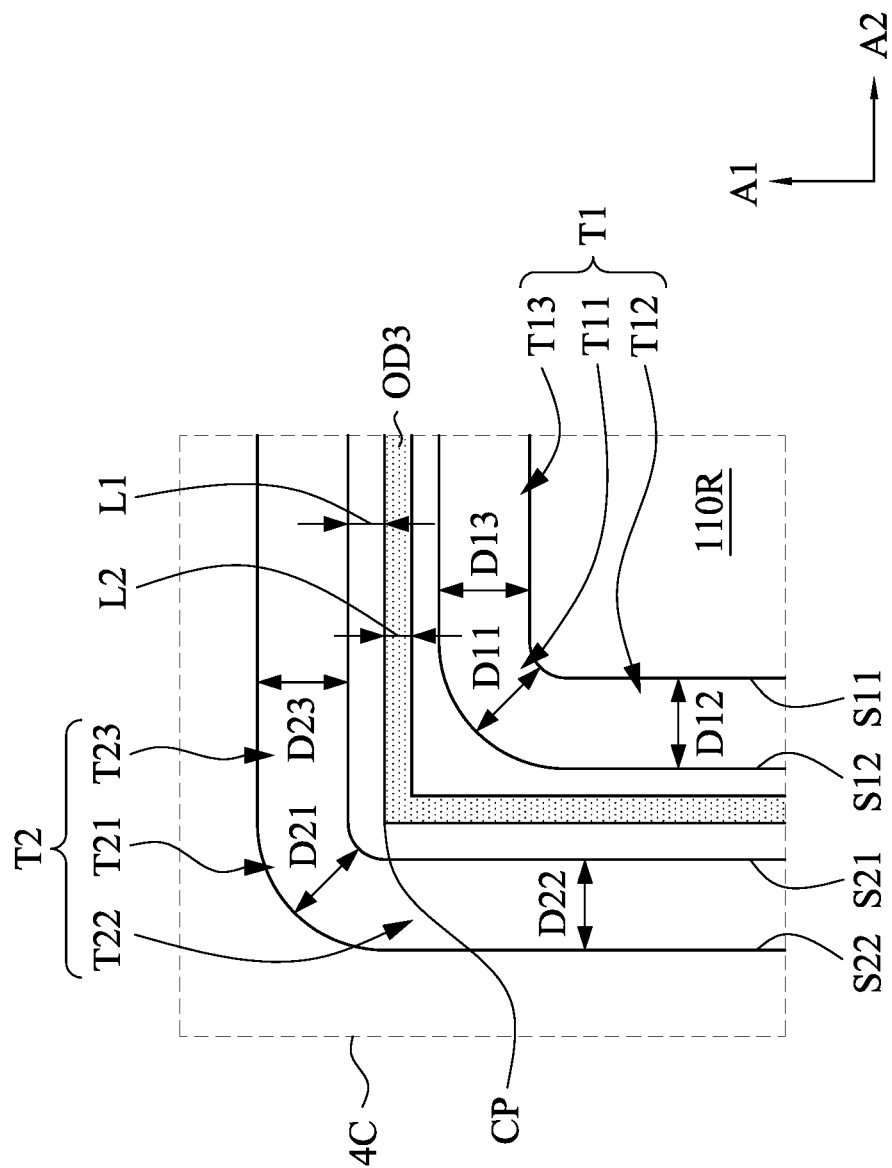

Reference is made to FIG. 4A to 4C. FIG. 4C is an enlarged view of a portion 4C of FIG. 4A. In the present embodiments, the trench T1 adjoins sides and corners of the device region 110R, and the trench T1 is designed to have a substantially constant width for reducing etching loading issue in subsequent processes for the formation of insulating layers. That is, distances between a first sidewall S11 and a second sidewall S12 of the trench T1 keeps substantially the same at sides and corners. For example, the trench T1 has a side portion T12 extending along a direction A1, a side portion T13 extending along a direction A2, and a corner portion T11 connecting the side portion T12 to the side portion T13. The first sidewalls S11 and S12 of the side portion T11 has a distance D11 therebetween, the first sidewalls S11 and S12 of the side portion T12 has a distance D12 therebetween, the first sidewalls S11 and S12 of the corner portion T13 has a distance D13 therebetween. The distances D11, D12, and D13 are substantially equal to each other in the present embodiments. In the present embodiments, the portion T11 may be curved, such that the portions T11-T13 have substantially the same width (e.g., D11-D13). As shown in FIG. 4A, the first sidewalls S11 and S12 are both curved at four corners and having substantially the same curvature. For example, a difference between the distances D11 and D12 is designed to be less than 10% of the distance D11 or D12, such as 0.22 micrometers. Similarly, a difference between the distances D11 and D13 or a difference between the distances D12 and D13 is designed to be less than 10% of the distance D11, D12, or D13, such as 0.22 micrometers. If the difference between the distances D11 and D12 (or between the distances D11 and D13, between the distances D12 and D13) is greater than 10% of the distance D11, D12, or D13, the etching loading issue may result in asymmetric insulating layers in subsequent process. The direction A1 may cross the direction A2. For example, in present embodiments, the direction A1 is substantially orthogonal to the direction A2.

Similarly, in the present embodiments, the trench T2 is designed to have a substantially constant width. That is, distances between a first sidewall S21 and a second sidewall S22 of the trench T2 keeps substantially the same at sides and corners. For example, the trench T2 has a side portion T22 extending along the direction A1, a side portion T23 extending along the direction A2, and a corner portion T21 connecting the side portion T22 to the side portion T23. The first sidewalls S21 and S22 of the side portion T21 has a distance D21 therebetween, the first sidewalls S21 and S22 of the side portion T22 has a distance D22 therebetween, the first sidewalls S21 and S22 of the corner portion T23 has a distance D23 therebetween. The distances D21, D22, and D23 are substantially equal to each other in the present embodiments. In the present embodiments, the portion T21 may be curved, such that the portions T21-T23 have substantially the same width (e.g., D21-D23). As shown in FIG. 4A, the first sidewalls S21 and S22 are both curved at four corners and having substantially the same curvature. For example, a difference between the distances D21 and D22 is designed to be less than 10% of the distance D21 or D22, such as 0.22 micrometers. Similarly, a difference between the distances D21 and D23 or a difference between the distances D22 and D23 is designed to be less than 10% of the distance D21, D22, or D23, such as 0.22 micrometers. If the difference between the distances D21 and D22 (or between the distances D21 and D23, between the distances D22 and D23) is greater than 10% of the distance D21, D22, or D23, the etching loading issue may result in asymmetric insulating layers in subsequent process. In some embodiments, the distances D11-D13 and D21-D23 may be in a range of about 1.14 micrometers to about 10 micrometers. If distances D11-D13 and D21-D23 are less than about 1.14 micrometers, materials (e.g., dielectric or polysilicon) may not fill into the trenches T1 and T2. If distance D11-D13 and D21-D23 are greater than about 10 micrometers, chip area may be unnecessarily occupied and wasted. In this context, the distances D11-D13/D21-D23 between the sidewalls S11-S12/S22-S23 of the trenches T1/T2 may also be referred to as a width of the trenches T1/T2.

In some embodiments, the sidewalls S22-S23 of the corner portion T21 of the trenches T2 may be depicted as arcs taken the corner point CP of the region OD3 as a center of circle when viewing from the top views. For example, the sidewalls S22-S23 of the corner portion T21 is one-fourth of a circumference of the circle when viewing from the top views. The sidewalls S11-S12 of the corner portion T11 of the trenches T1 may have similar arc shape as that of the sidewalls S22-S23 of the corner portion T21 of the trenches T2 when viewing from the top views. A distance L1 between the sidewalls S21 and the outer edge of the region OD3 (e.g., the radius of the circle) may be in a range of about 0.8 micrometers to about 5 micrometers. If distance L1 is less than about 0.08 micrometers, the region OD3 may bridge and connect with materials in the trenches T1 or T2, which would result in undesired electrical connection. If distance L1 is greater than about 5 micrometers, chip area may be unnecessarily occupied and wasted. In some embodiments, a width L2 of the region OD3 may be in a range of about 0.08 micrometers to about 2 micrometers. If width L2 of the region OD3 is less than about 0.08 micrometers, the region OD3 may be too thinned to be patterned by lithography process. If width L2 of the region OD3 is greater than about 2 micrometers, chip area may be unnecessarily occupied and wasted.

In the present embodiments, the distances D11-D13 of the trench T1 is designed to be similar to the distances D21-D23 of the trench T2. In some other embodiments, the distances D11-D13 of the trench T1 is different from the distances D21-D23 of the trench T2. For example, at least one of the distances D11-D13 of the trench T1 is smaller or greater than at least one of the distances D21-D23 of the trench T2.

Figure 5:
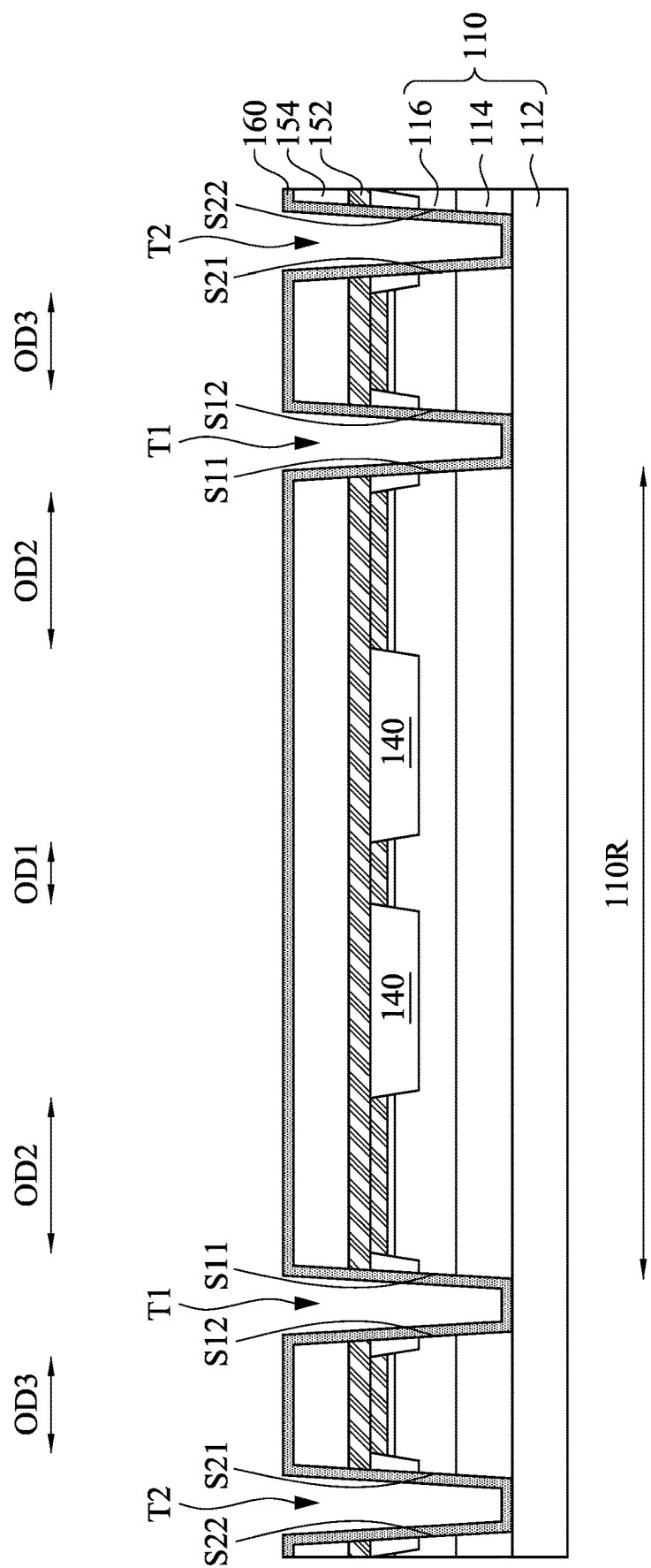

Reference is made to FIG. 5. An insulating film 160 is deposited over the structure of FIGS. 4A-4C. For example, the insulating film 160 is formed over top surfaces of the dielectric layer 154, the sidewalls S11 and S12 of the trench T1, the sidewalls S21 and S22 of the trench T2, and the surfaces of the substrate 112 exposed by the trenches T1 and T2. The insulating film 160 may include silicon oxides, silicon nitride, silicon oxynitride, or the combination thereof. The deposition of the insulating film 160 may include chemical vapor deposition (CVD), physical vapor deposition (PVD), other suitable process, or the like. For example, in some embodiments, the insulating film 160 may include an oxide-nitride-oxide (ONO) structure. The insulating film 160 may have a thickness in a range of about 570 nanometers to about 700 nanometers. If the insulating film 160 is thinner than about 570 nanometers, the transistor device (e.g., LDMOS) formed in subsequent process may breakdown. If the insulating film 160 is thicker than about 700 nanometers, the space in the trenches T1 and T2 may be so limited such that polysilicon may not be well deposited into the trenches T1 and T2.

Figure 6A:
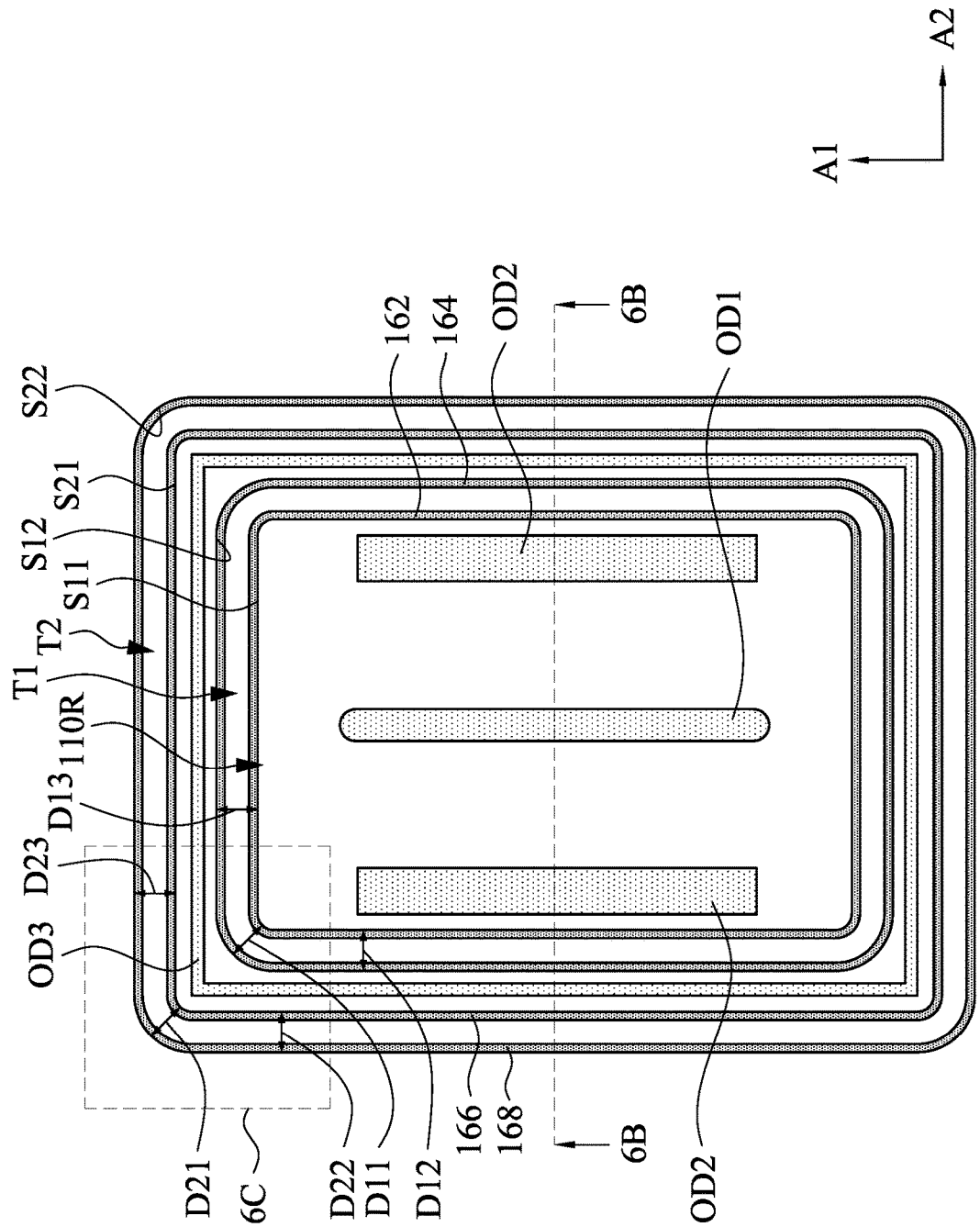
Figure 6B:
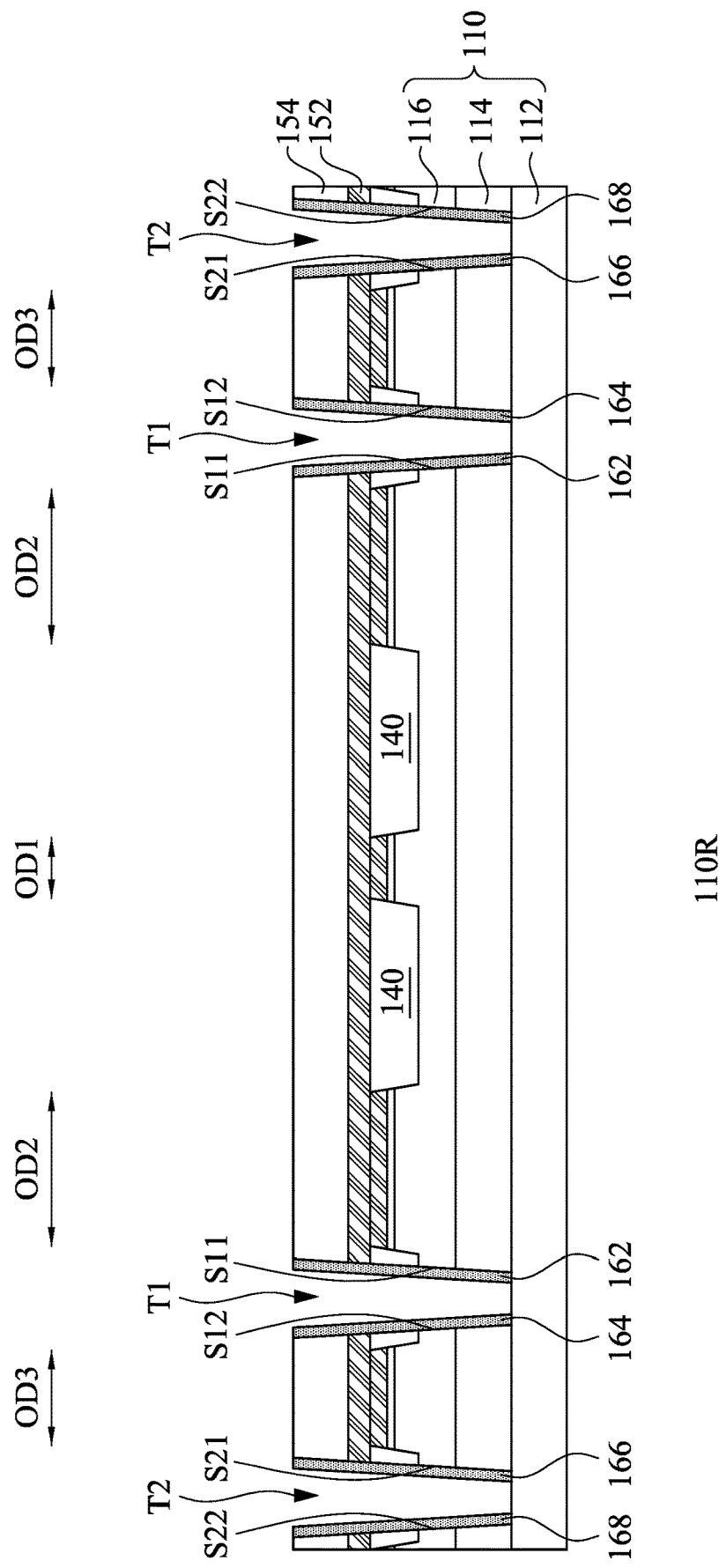
Figure 6C:
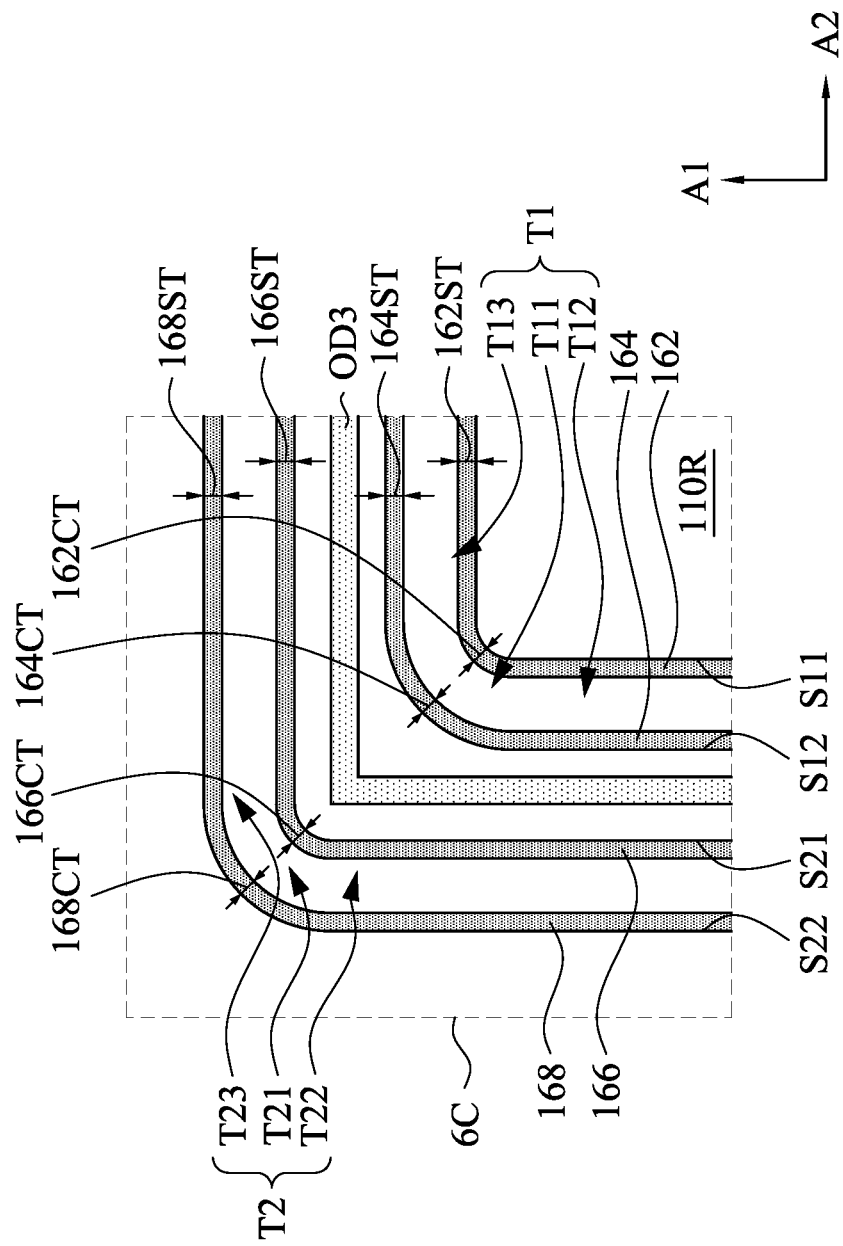

Reference is made to FIG. 6A to 6C. FIG. 6B is a schematic cross-sectional view taken along line 6B-6B in FIG. 6A. FIG. 6C is an enlarged view of a portion 6C of FIG. 6A. The insulating film 160 (referring to FIG. 5) is patterned to expose portions of the substrate 110. The patterning process may include an anisotropic etching process, such as dry etching process. In some embodiments, the etching process removes a horizontal portion of the insulating film 160 (referring to FIG. 5) over the top surfaces of the dielectric layer 154 and horizontal portions of the insulating film 160 (referring to FIG. 5) over the surfaces of the substrate 110 exposed by the trenches T1 and T2, but leaves vertical portions of the insulating film 160 over the sidewalls S11, S12, S21, and S22 of the trenches T1 and T2. The remaining vertical portions of the insulating film 160 are referred to as insulating layers 162, 164, 166, 168 hereinafter. In some embodiments, the insulating layers 162 and 164 passivate the sidewalls S11 and S12 of the trench T1 and expose the portions of the substrate 112, and insulating layers 166 and 168 passivate the sidewalls S21 and S22 of the trench T2 and expose the portions of the substrate 112.

The vertical portions of the insulating film 160 may be thinned during the etching process. In some cases where a width of the trench T1 at corners is much greater than a width of the trench T1 at sides (e.g., the distance D11 is much greater than the distances D12 and D13), due to etch loading issues, vertical portions of the insulating film 160 would be thinned unevenly, which would result in asymmetric insulating layers at corners. To be specific, when the etching process is tuned to form insulating layer 162-168 at four sides with having similar thicknesses, the insulating layer 162 at fourth corners would be much thinner than the insulating layer 164 at fourth corners, and the insulating layer 166 at fourth corners would be much thinner than the insulating layer 168 at fourth corners. For example, when the distance D11 is much greater than the distances D12 and D13, the insulating layer 162 in the corner portion T11 of the trenches T1 (referring to FIG. 6C) would be much thinner than the insulating layer 164 in the corner portion T11 of the trenches T1 (referring to FIG. 6C), and the insulating layer 166 in the corner portion T21 of the trenches T2 (referring to FIG. 6C) would be much thinner than the insulating layer 168 in the corner portion T21 of the trenches T2 (referring to FIG. 6C). The thickness difference of the insulating layers would have a large impact on isolation performance.

In the present embodiments, the trench T1 and T2 are designed to have a constant width at corners and sides (e.g., the distances D11-D13/D21-D23 in FIG. 4C are substantially equal to each other), such that when the etching process is tuned to form insulating layer 162-168 at four sides having similar thickness, the insulating layers 162 at corner would has a thickness 162CT similar to a thickness 164CT of the insulating layers 164 at corner, and the insulating layers 166 at corner would has a thickness 166CT similar to a thickness 168CT of the insulating layers 168 at corner. For example, a thickness 162ST of the insulating layer 162 and a thickness 164ST of the insulating layer 164 is less than 10% of the thickness 162ST/164ST and a difference of a thickness 162CT of the insulating layer 162 and a thickness 164CT of the insulating layer 164 is less than 10% of the thickness 162CT/164CT. For example, a difference of a thickness 166ST of the insulating layer 166 and a thickness 168ST of the insulating layer 168 is less than 10% of the thickness 166ST/168ST, and a difference of a thickness 166CT of the insulating layer 166 and a thickness 168CT of the insulating layer 168 is less than 10% of the thickness 166CT/168CT. Through the configuration, the process window for sidewall oxide etching process is improved, and the sidewall oxide asymmetric issue is solved.

Figure 7:
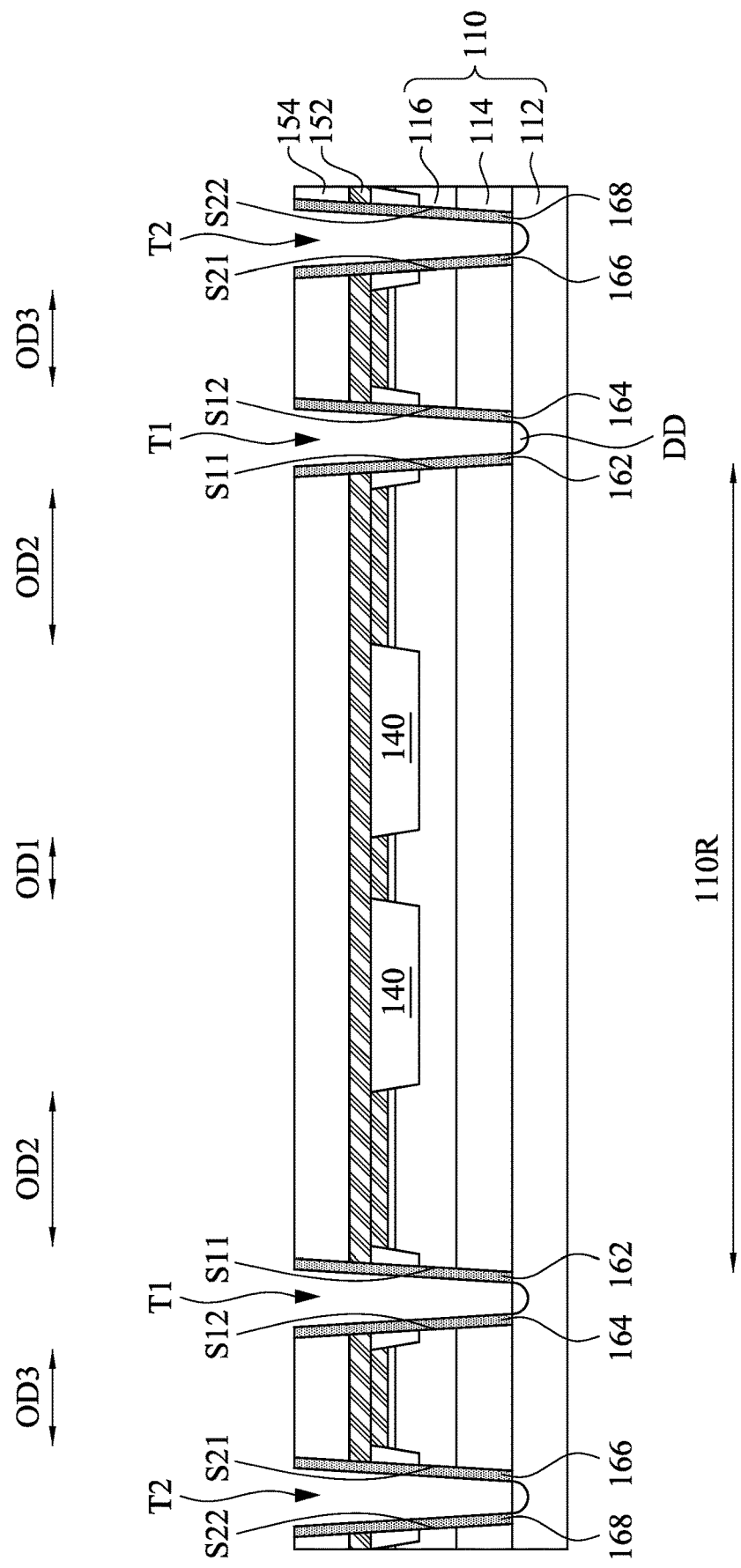

Reference is made to FIG. 7. An ion implantation is performed to implant dopants of the same conductive type as that in the semiconductor base substrate 112, thereby forming doped regions DD in portions of the substrate 112 exposed by the trenches T1 and T2 and the insulating layers 162-168. In some examples, the underlying substrate 112 is a p-type doped silicon substrate and the ions used in the ion implantation can be p-type dopants, e.g., such as boron or indium. In some other examples, the underlying substrate 112 is a n-type doped silicon substrate and the ions used in the ion implantation can be n-type dopants, e.g., such as phosphorus, arsenic, or antimony. An annealing process may then be performed to activate the doped regions DD. In some other embodiments, the formation of the doped regions DD may be omitted.

Figure 8:
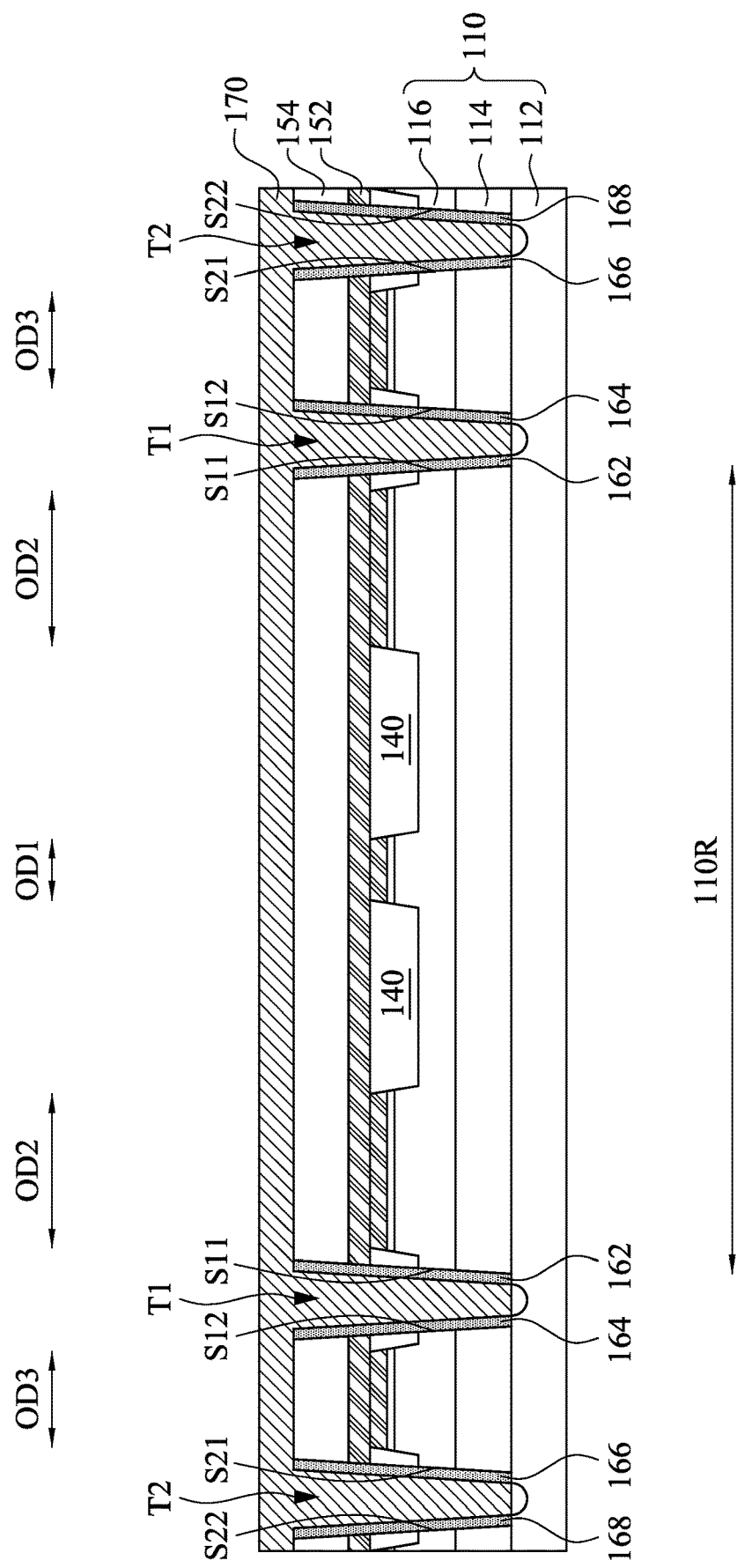

Reference is made to FIG. 8. The trenches T1 and T2 are overfilled with a conductive material 170, such as polysilicon or metal. The conductive material 170 may include one or plural layers. For example, the polysilicon conductive material 170 may be deposited using furnace or other suitable methods.

In some cases where a width of the corner portion T11/T21 of the trench T1/T2 at corners (i.e., the distances D11/D21 in FIG. 6A) is much greater than a width of the side portions T12-T13/T22-T23 of the trench T1/T2 at sides (i.e., the distances D12-D13/D22-D23 in FIG. 6A), the conductive material 170 may not fill the corner portion T11/T21 of the trench T1/T2 when the side portions T12-T13/T22-T23 of the trench T1/T2 are filled with conductive material 170, which in turn will result in voids in the conductive material 170 in the corner portion T11/T21 of trench T1/T2. In the present embodiments, a width of the corner portion T11/T21 of the trench T1/T2 at corners (i.e., the distances D11/D21 in FIG. 6A) is substantially the same as a width of the side portions T12-T13/T22-T23 of the trench T1/T2 at sides (i.e., the distances D12-D13/D22-D23 in FIG. 6A). Since the trench T1/T2 have substantially the same width at side and corners, the conductive material 170 may fill the corner portion T11/T21 and the side portions T12-T13/T22-T23 of trench T1/T2 (referring to FIG. 6A) without void therein. Through the configuration, process window for contact vias connected to the conductive plugs 172 and 174 is enlarged, and the conductive plugs 172 and 174 may be prevented from contact open issue.

Figure 9:
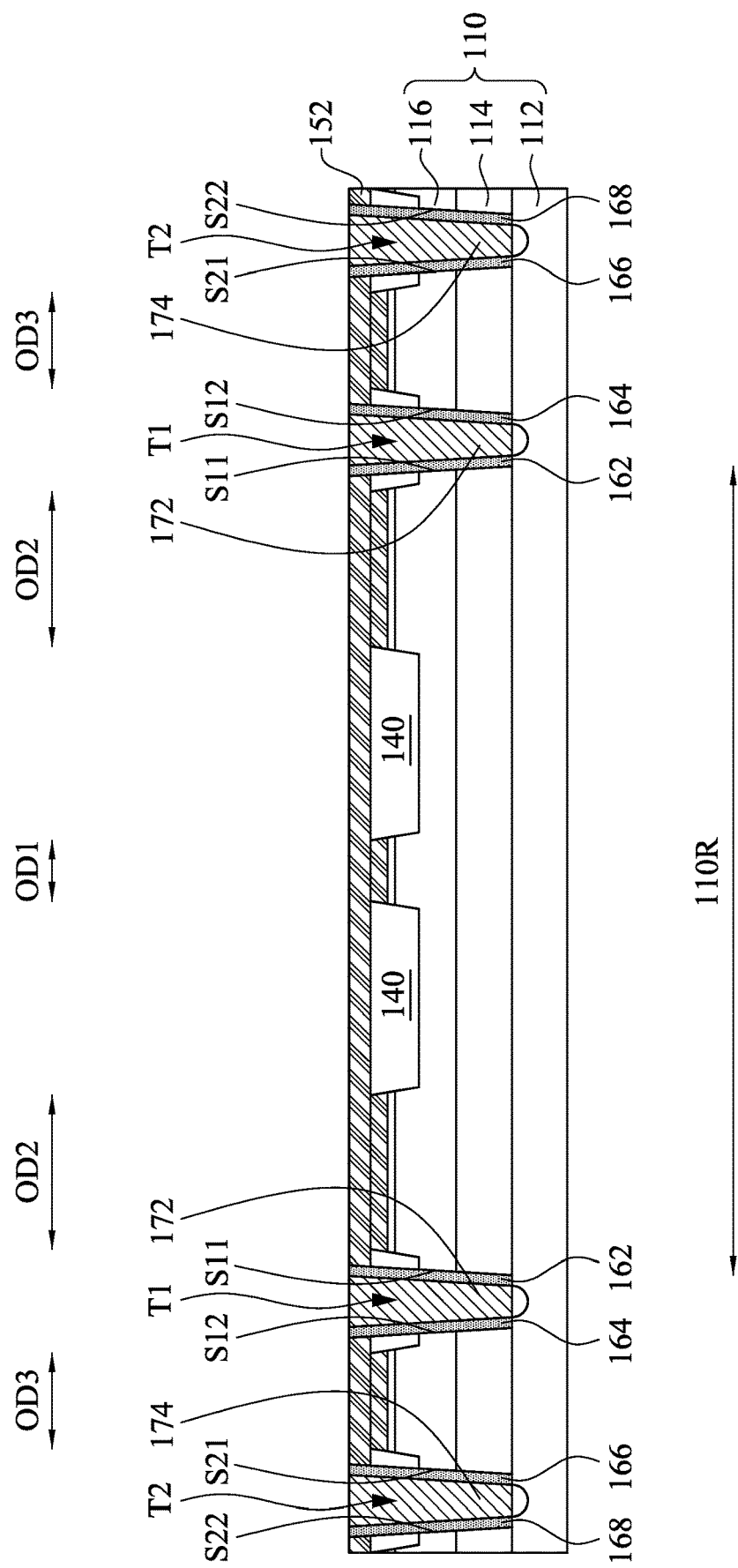

Reference is made to FIG. 9. A chemical-mechanical polish (CMP) process is performed to the structure of FIG. 8, such that a portion of the conductive material 170 (referring to FIG. 8) out of the trench T1 is removed, and the conductive material 170 in the trench T1 forms conductive plugs 172 and 174. The CMP process may also remove the insulating layers 162-168 and the dielectric layer 154 over the silicon nitride layer 152. In some embodiments, the silicon nitride layer 152 may have a higher resistance to the CMP process than that of the conductive material 170 (referring to FIG. 8), the insulating layers 162-168, and the dielectric layer 154, such that a removing rate of the silicon nitride layer 152 is slower than that of the insulating layer 162-168, the dielectric layer 154, and the conductive material 170. Through the configuration, a top surface of the semiconductor structure may be planarized with respect to a top surface of the silicon nitride layer 152. For examples, top surfaces of the conductive plugs 172 and 174 are substantially level with respect to the top surface of the silicon nitride layer 152.

Figure 10A:
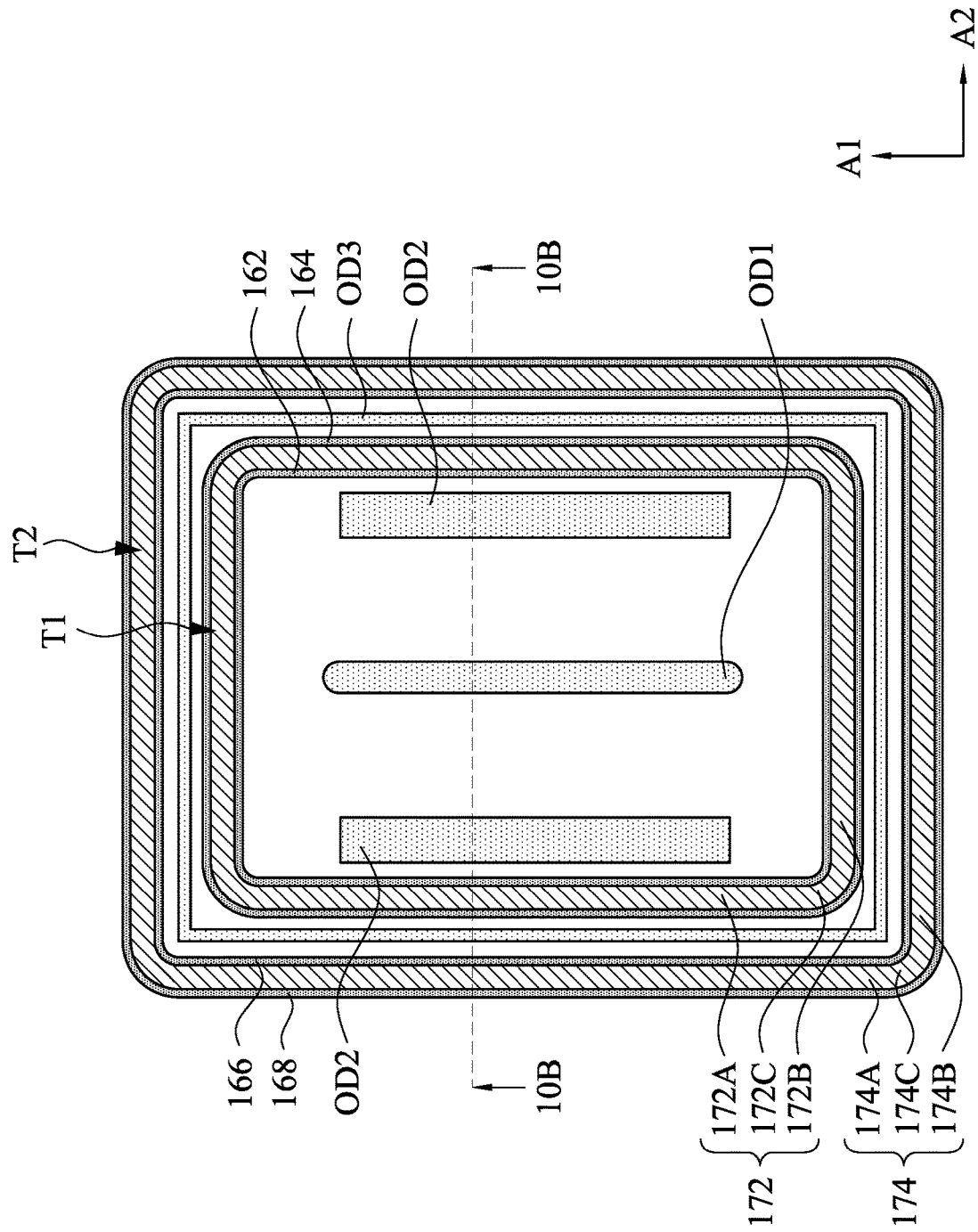
Figure 10B:
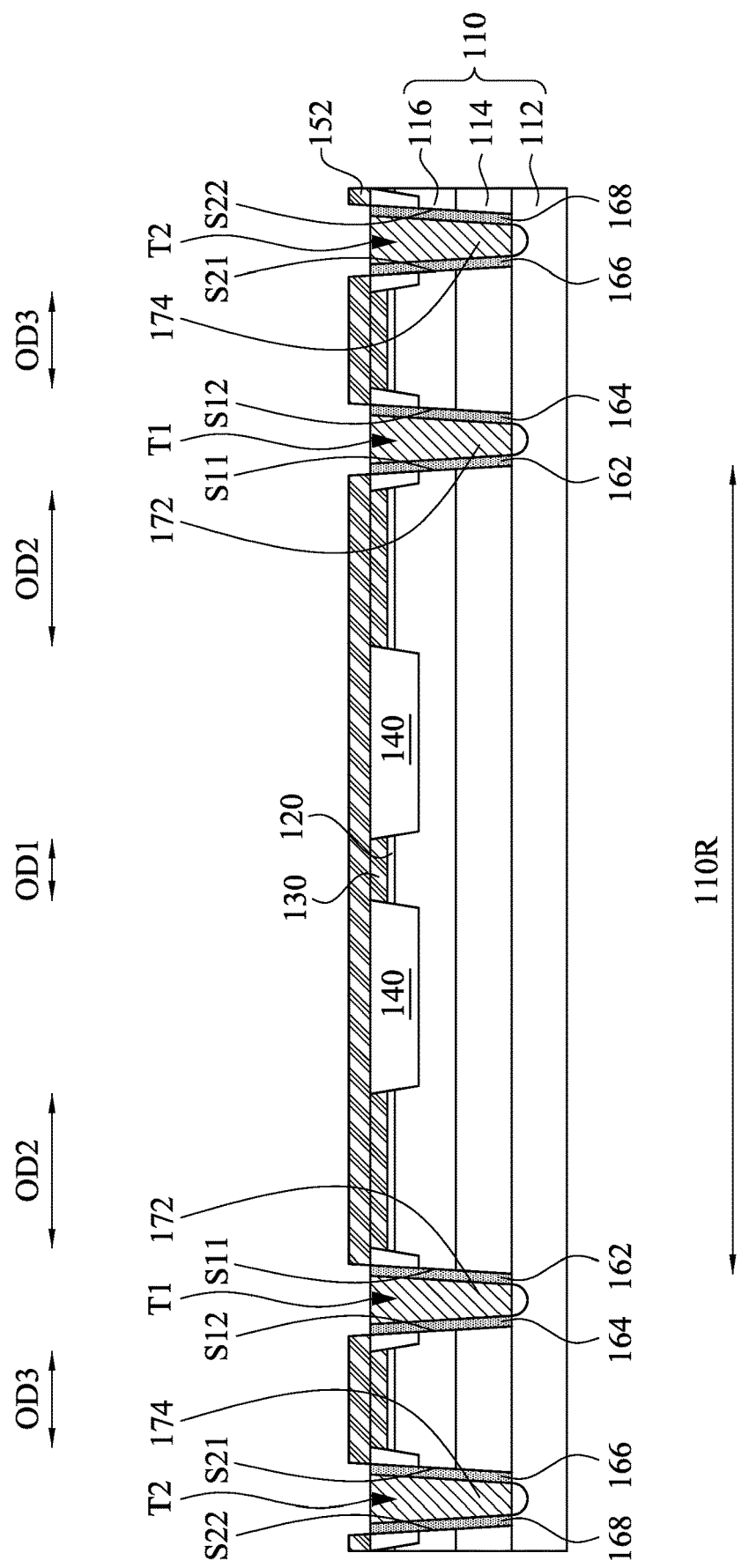

Reference is made to FIGS. 10A and 10B. FIG. 10B is a schematic cross-sectional view taken along line 10B-10B in FIG. 10A. The conductive plugs 172 and 174 and the insulating layer 162-168 are etched back by plural etching back processes, such that top surfaces of the conductive plugs 172 and 174 and the insulating layer 162-168 are lowered. For example, after the etching back processes, the top surfaces of the conductive plugs 172 and 174 and the insulating layers 162-168 may be level with top surfaces of the isolation structure 140, thereby reducing the topography difference between the device region 110R and the region out of the device region 110R where the conductive plugs 172 and 174 are disposed, such that the device region 110R and the region out of the device region 110R may have substantially the same step height. In some embodiments, due to fabrication variations, the top surfaces of the conductive plugs 172 and 174 and the insulating layers 162-168 may be lower than the top surfaces of the isolation structure 140. Furthermore, in some embodiments, due to fabrication variations, the top surfaces of the conductive plugs 172 and 174 may be lower than the top surfaces of insulating layers 162-168.

The etching back processes may include a first process to remove the polysilicon of the conductive plugs 172 and 174 and a second process to remove oxides of the insulating layers 162-168. The first and second processes may be repeated. For example, the first process may be a dry etch using gas etchants, such as $CF_4$, to remove polysilicon. For example, the second process may be a wet clean using suitable liquid, such as diluted HF (DHF), to remove oxides. The silicon nitride layer 152 may have a higher etch resistance to the first process (e.g., the dry etch) than that of the polysilicon of the conductive plugs 172 and 174, and the silicon nitride layer 152 may have a higher resistance to the second process (e.g., the wet clean) than that of the oxides of the insulating layer 162-168. Through the configuration, the silicon nitride layer 152 may not be etched and removed during the etching back processes, and the silicon nitride layer 152 may protect underlying layers from being etched and removed during the etching back processes.

In some embodiments, the conductive plugs 172 and 174 surround the device region 110R and have bottom surfaces in contact with a top surface of the semiconductor base substrate 112. The conductive plugs 172 and 174 are surrounded and insulated from the semiconductor layer 116 by the adjacent insulating layer 162, 164, 166, 168. In the context, the conductive plugs 172 and 174 may also be referred to as conductive rings or conductive features.

In the present embodiments, the insulating layers 162, 164, 166, 168 and the conductive plugs 172 and 174 are curved at four corners in accordance with the profile of the trenches T1 and T2 (referring to FIGS. 6A-6C). To be specific, the conductive plug 172 has a side portion 172A extending along the direction A1, a side portion 172B extending along the second direction A2, and a corner portion 172C connecting the side portion 172A to the side portion 172B. The corner portion 172C may be curved. In some embodiments, a difference between a width of the corner portion 172C of the conductive plug 172 and a width of the side portion 172A/172B of the conductive plug 172 is less than 10% of the width of the portion 172A/172B/172C. Similarly, the conductive plug 174 has a side portion 174A extending along the direction A1, a side portion 174B extending along the direction A2, and a corner portion 174C connecting the side portion 174A to the side portion 174B. The corner portion 174C may be curved. In some embodiments, a difference between a width of the corner portion 174C of the conductive plug 174 and a width of the side portion 174A/174B of the conductive plug 174 is less than 10% of the width of the portion 174A/174B/174C.

Figure 11:
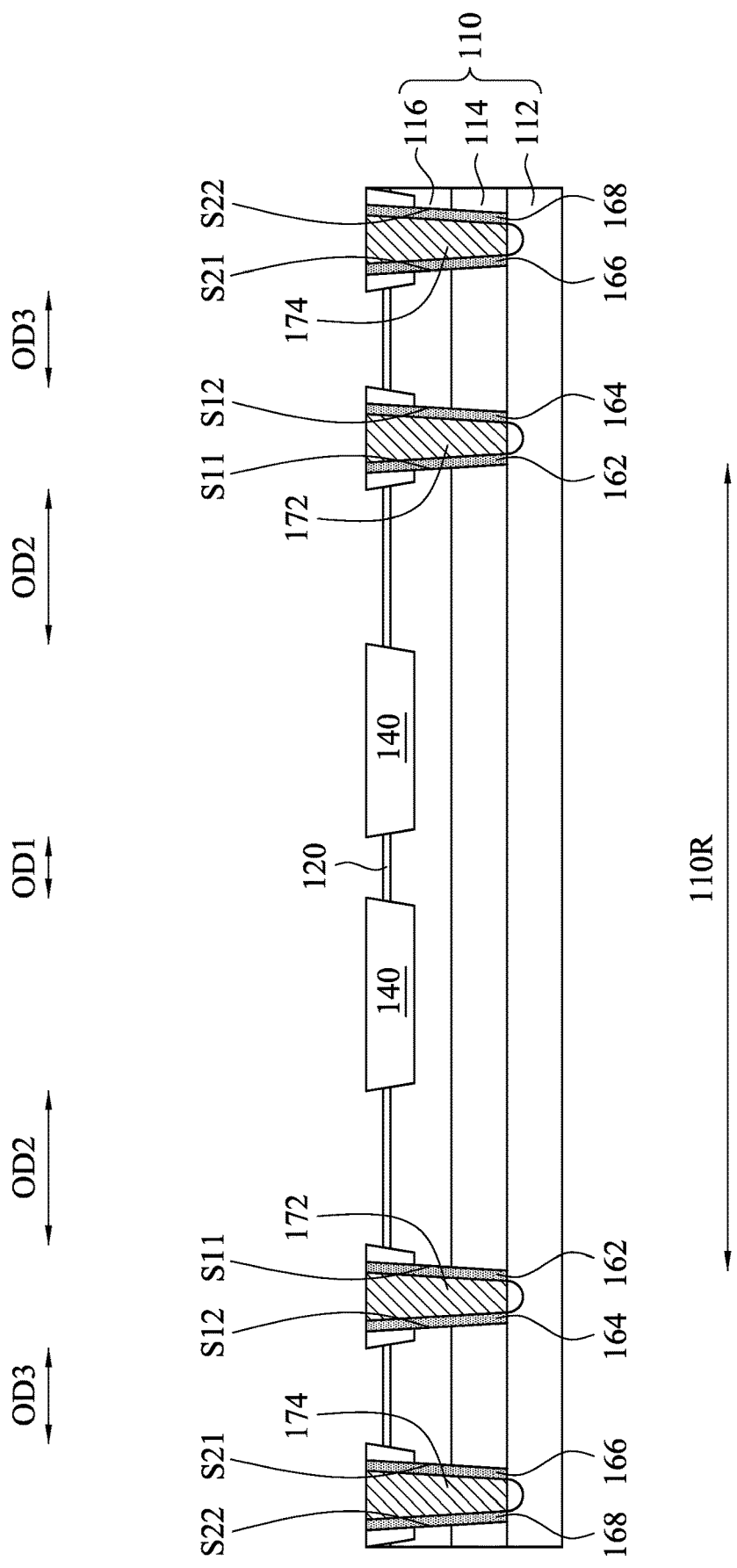

Reference is made to FIG. 11. The silicon nitride layer 152 and the hard mask layer 130 are removed by suitable etching process. For example, etchants for removing silicon nitride, such as phosphorus acid, are used during removing the silicon nitride layer 152 and the hard mask layer 130. In some embodiments, the pad layer 120 and the isolation structure 140 have a higher etch resistance to the etchants than that of the silicon nitride layer 152 and the hard mask layer 130, such that materials under the pad layer 120 and the isolation structure 140 are prevented from being etched by the etching process. After removing the silicon nitride layer 152 and the hard mask layer 130, top surfaces of the isolation structure 140 are exposed.

Figure 12:
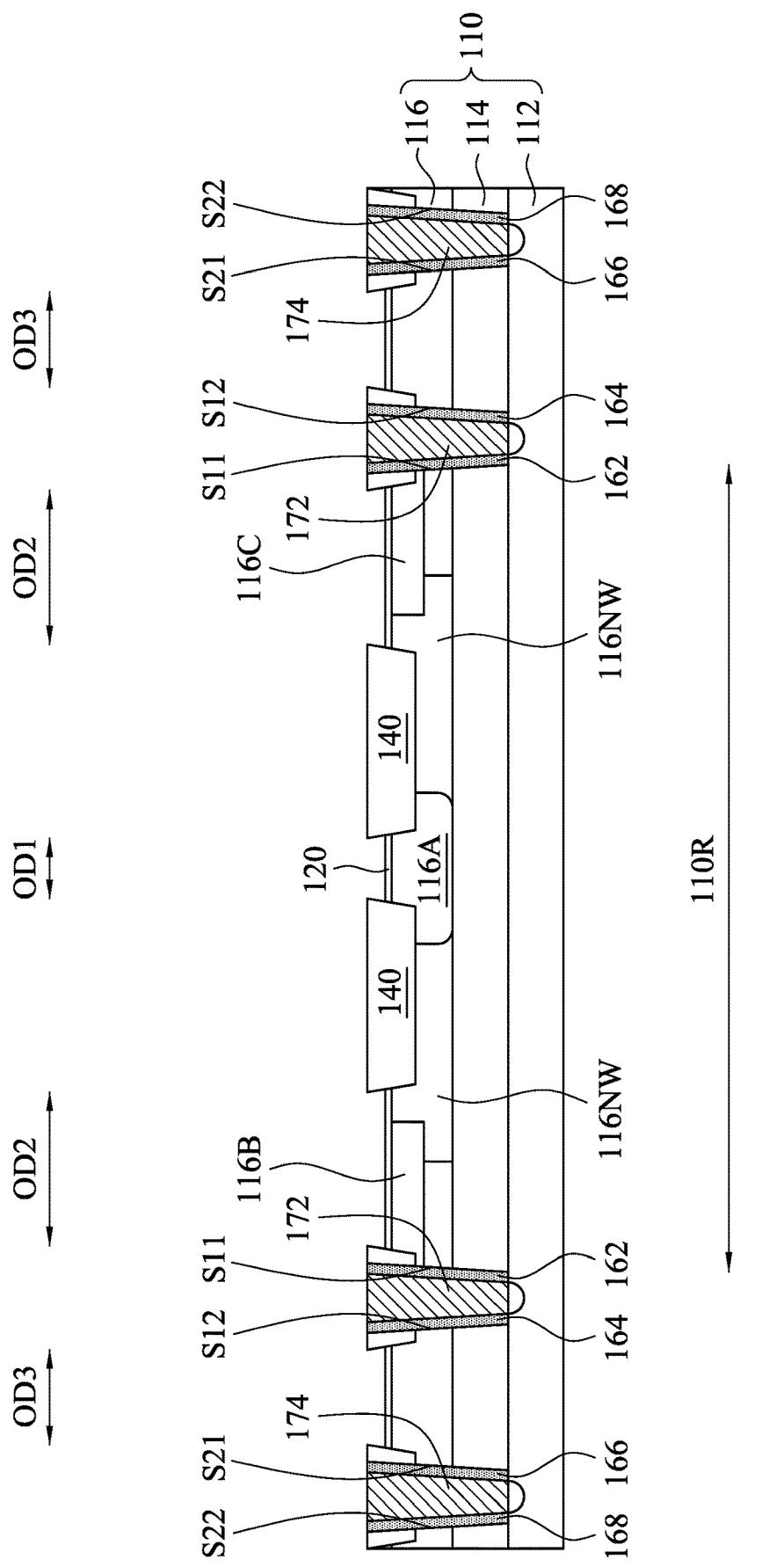

Reference is made to FIG. 12. High voltage n-type well (HVNW) regions 116NW are formed through suitable semiconductor doping techniques such as an ion implantation process in some embodiments. In some embodiments, appropriate n-type dopants such as phosphorous, arsenic and/or the like are implanted into the semiconductor layer 116 to form the HVNW region 116NW. In some embodiments, the doping concentration of the HVNW region 116NW is in a range from about $1\times10^{15}/cm^3$ to about $1\times10^{18}/cm^3$. By controlling the ion implantation energy, the dopants may penetrate through the top surface of the semiconductor layer 116 as well as the isolation structures 140. The depth of the HVNW region 116NW may be adjusted accordingly.

P-type body regions 116A, 116B, 116C are formed in the HVNW region 116NW through suitable semiconductor doping techniques such as an ion implantation process. In some embodiments, appropriate p-type dopants such as boron, gallium, indium and/or the like are implanted into the HVNW region 116NW to form the p-type body regions 116A, 116B, 116C. In some embodiments, the doping concentration of the p-type body regions 116A, 116B, 116C is in a range from about $1\times10^{15}/cm^3$ to about $1\times10^{18}/cm^3$. By controlling the ion implantation energy, the depths of p-type body regions 116A, 116B, 116C may be adjusted accordingly. In some embodiments, after the formation of the well regions, prior to the formation of gate dielectric, the underlying pad layer 120 may also be removed by suitable etching process.

Figure 13:
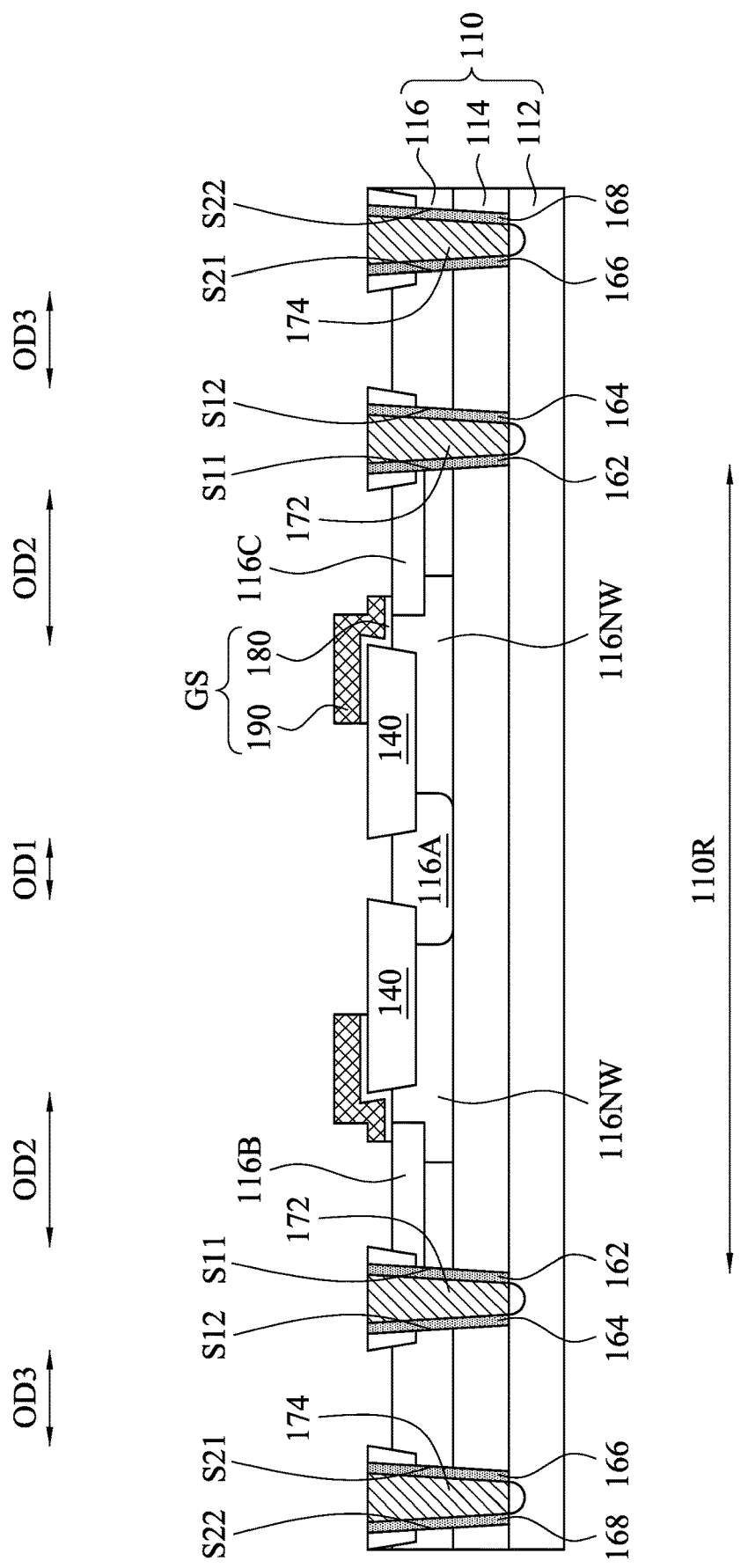

Reference is made to FIG. 13. Plural gate stacks GS are formed over the N-type well regions NW and P-type well region PW. Each of the gate stacks GS may include a gate dielectric 180 and a gate electrode 190 over the gate dielectric 180. The gate dielectric 180 may be formed of suitable dielectric material such as silicon oxide, silicon oxynitride, silicon nitride, an oxide, a nitrogen-containing oxide, aluminum oxide, lanthanum oxide, hafnium oxide, zirconium oxide, hafnium oxynitride, combinations thereof and/or the like. The gate electrodes 190 may include a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like.

In some embodiments where the gate dielectrics 180 include oxides, a gate dielectric layer may be formed by a plasma enhanced CVD (PECVD) process using tetraethoxysilane (TEOS) and oxygen as a precursor. In some embodiments where the gate electrodes 190 are formed of polysilicon, the gate electrodes 190 may be formed by depositing doped or undoped poly-silicon by low-pressure chemical vapor deposition (LPCVD). After the deposition of doped or undoped poly-silicon, suitable photolithography and etching process may be employed to defined the gate electrodes 190. The portion of the gate dielectric layer not covered by the gate electrodes 190 may be removed after the etching process, such that the gate electrodes 190 are formed over the gate dielectric layers 180 respectively.

After the formation of the gate stacks GS, spacers may be formed on opposite sides of the gate stack GS. The spacers may be formed by blanket depositing one or more spacer layers (not shown) over the gate stacks GS. The spacers may include suitable dielectric materials such as SiN, oxynitride, SiC, SiON, oxide and/or the like.

Figure 14:
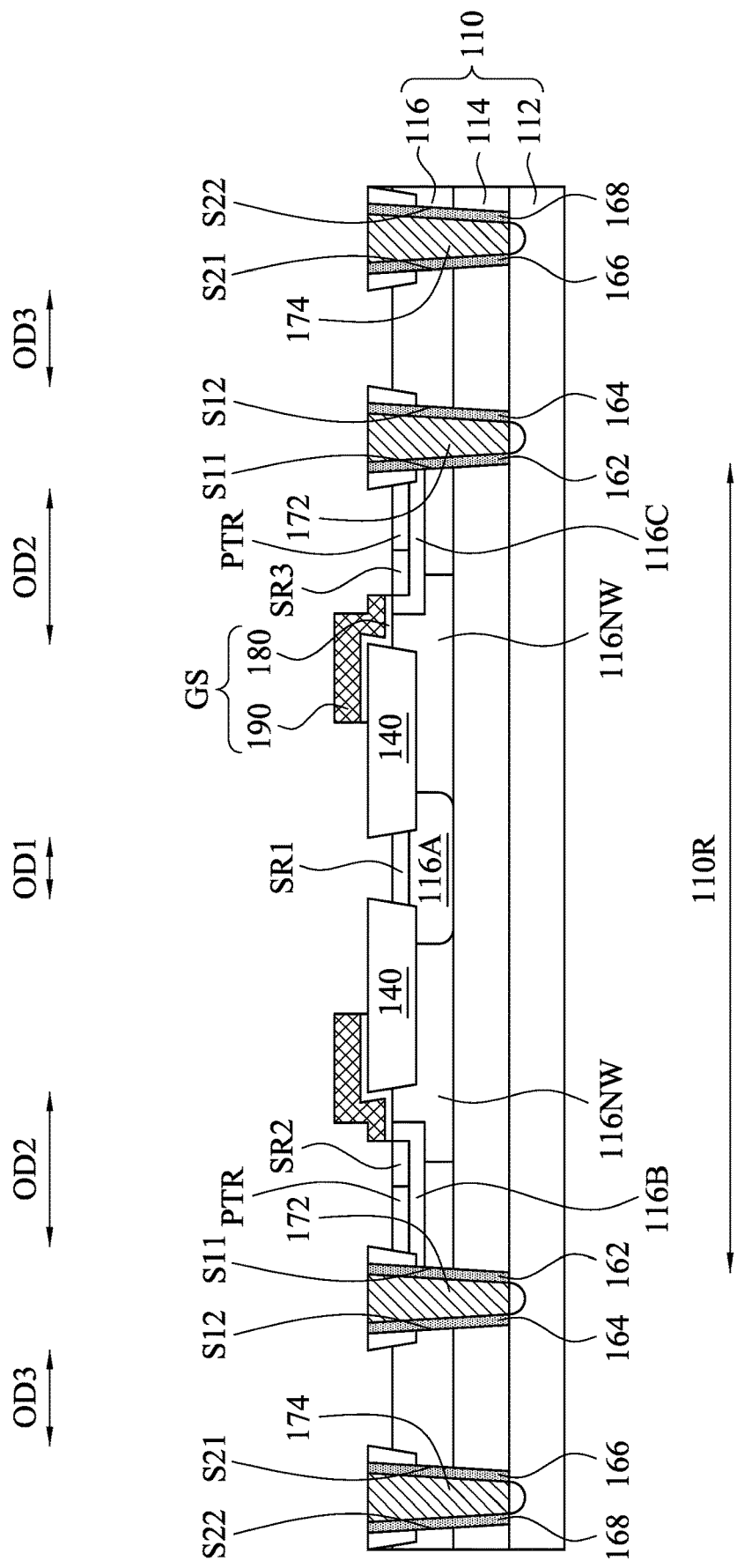

Reference is made to FIG. 14. Source/drain regions SR1-SR3 are formed in the semiconductor layer 116, thereby forming transistors (including the gate structures GS and the source/drain regions SR1-SR3) in the device region 110R. In the present embodiments, n-type dopants are implanted into a portion of the p-type body region 116A, a portion of the p-type body region 116C, and the p-type body region 116B to form plural n-type regions (i.e., the source/drain regions SR1-SR3), respectively. Afterward, p-type dopants are implanted into another portion of the p-type body region 116A and another portion of the p-type body region 116C to form the plural p-type regions PTR proximate the source/drain regions SR1 and SR2. The p-type regions PTR may contact the p-type body region 116A and 116C. In order to eliminate the body effect, the p-type regions PTR may be coupled to the source/drain regions SR2-SR3 directly through metallization pattern later formed.

Figure 15A:
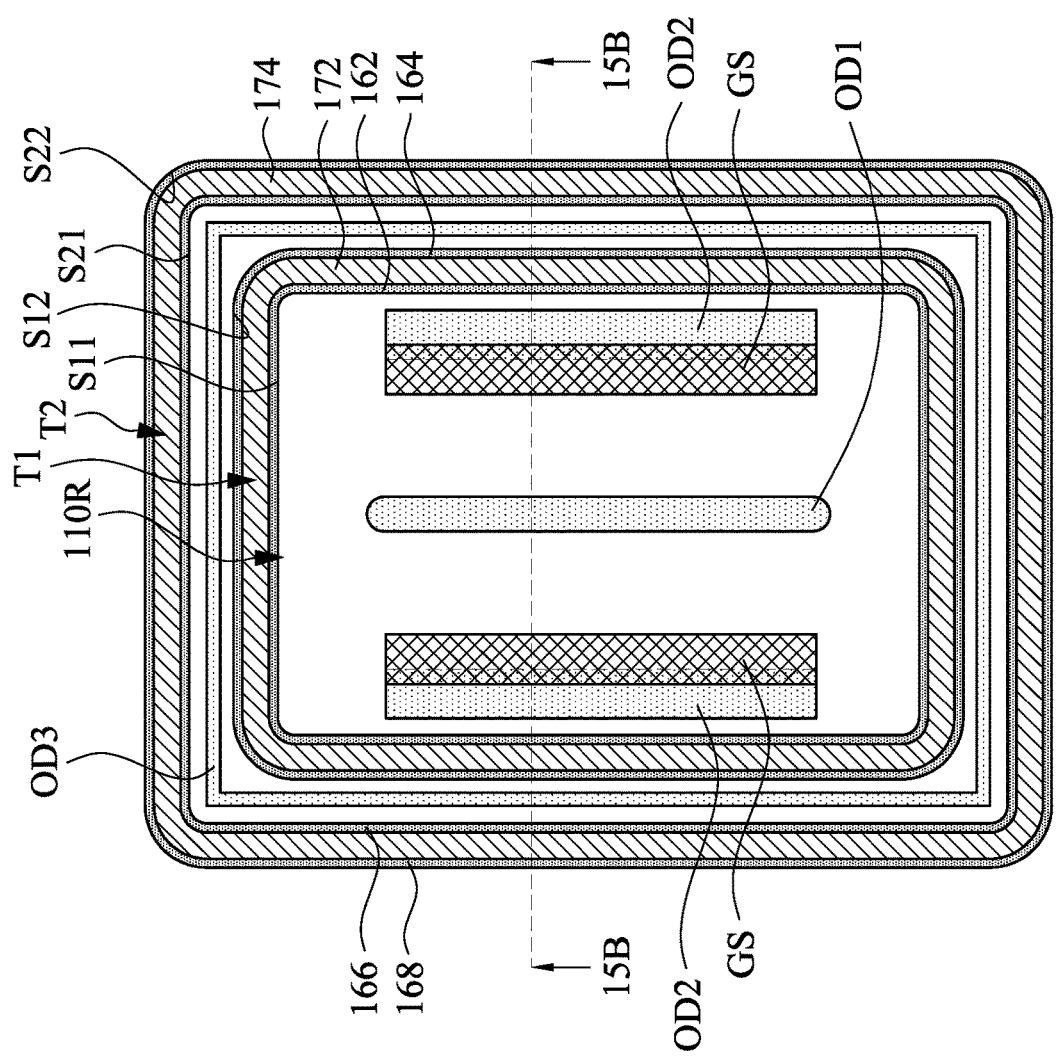
Figure 15B:
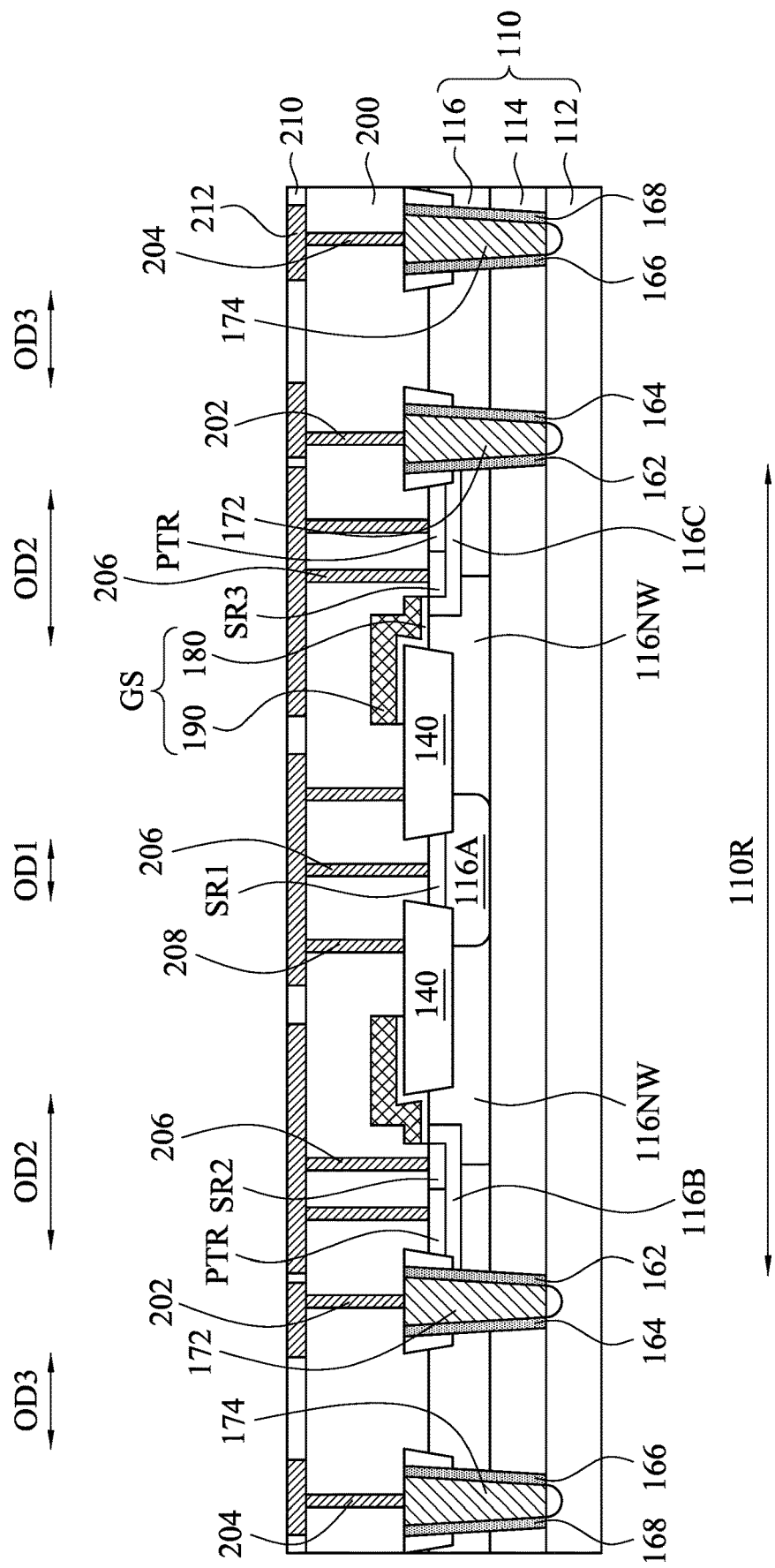

Reference is made to FIGS. 15A and 15B. FIG. 15B is a schematic cross-sectional view taken along line 15B-15B in FIG. 15A. An interlayer dielectric (ILD) layers 200 and 210 are formed over the structure of FIG. 14, and a metallization pattern including plural contacts (e.g., contact vias 202-208) and a metal wire layer 212 are formed in the ILD layers 200 and 210.

In some embodiments, the ILD layer 200 may include an oxide (e.g., $SiO_2$), an ultra-low k dielectric material, a low-k dielectric material (e.g., SiCO), or the like. In some embodiments, the ILD layer 200 may be formed by a vapor deposition process. The ILD layer 200 is etched to form contact openings therein. The contact openings are filled with one or more conductive materials. In some embodiments, the one or more conductive materials may include tungsten (W), titanium (Ti), titanium nitride (TiN), and/or tantalum nitride (TaN). In some embodiments, a diffusion barrier layer and/or a liner layer may be deposited into the contact openings prior to depositing the one or more conductive materials. In some embodiments, the one or more conductive materials may be deposited by way of a vapor deposition technique (e.g., CVD, PVD, plasma-enhanced CVD (PE-CVD), etc.) and/or a plating process (e.g., an electroplating or electro-less plating process). A planarization process (e.g., CMP) may be subsequently performed to remove excess of the one or more conductive materials and to form a planar surface, thereby forming plural contact (e.g., the contact vias 202-208 and gate contact (not shown)) in the ILD layer 200. In the present embodiments, the contact via 202 is connected to the conductive plug 172, the contact via 204 is connected to the conductive plug 174, the contact vias 206 are connected to the source/drain regions SR1-SR3 and the p-type regions PTR, and the gate contact (not shown) is connected to the gate electrode 190. In the present embodiments, the semiconductor base substrate 112 may be electrically bias by the contact plugs 172 and 174. In some embodiments, the semiconductor base substrate 112 may be electrically biased by the contact plug 172, while the conductive plug 174 is floating in which the contact vias 204 may be omitted. For example, a top surface of the conductive plug 174 may be entirely covered by the ILD layer 210, not in contact with a contact via.

In some embodiments, since the conductive material 170 may fill the corner portion T11/T21 and the side portions T12-T13/T22-T23 of trench T1/T2 (referring to FIG. 6A) without void therein, process window for contact vias connected to the conductive plugs 172 and 174 is enlarged, and the conductive plugs 172 and 174 may be prevented from contact open issue.

Another ILD layer 210 is formed over the ILD layer 200 and a back-end-of-the-line (BEOL) metal wire layer 212 is formed within the ILD layer 210. In various embodiments, the ILD layer 210 may be formed by depositing an ILD material over the ILD layer 200. The ILD layer 210 is subsequently etched to form trenches extending within the ILD layer 210. The trenches are filled with a conductive material and a planarization process (e.g., CMP) is performed to remove excess of the conductive material from over the ILD layer 210, thereby forming the metal wire layer 212. In some embodiments, the one or more conductive materials may be deposited by way of a vapor deposition technique (e.g., CVD, PVD, PE-CVD, etc.) and/or a plating process (e.g., an electroplating or electro-less plating process). In some embodiments, the one or more conductive materials may include tungsten (W), titanium (Ti), titanium nitride (TiN), and/or tantalum nitride (TaN).

Figure 16A:
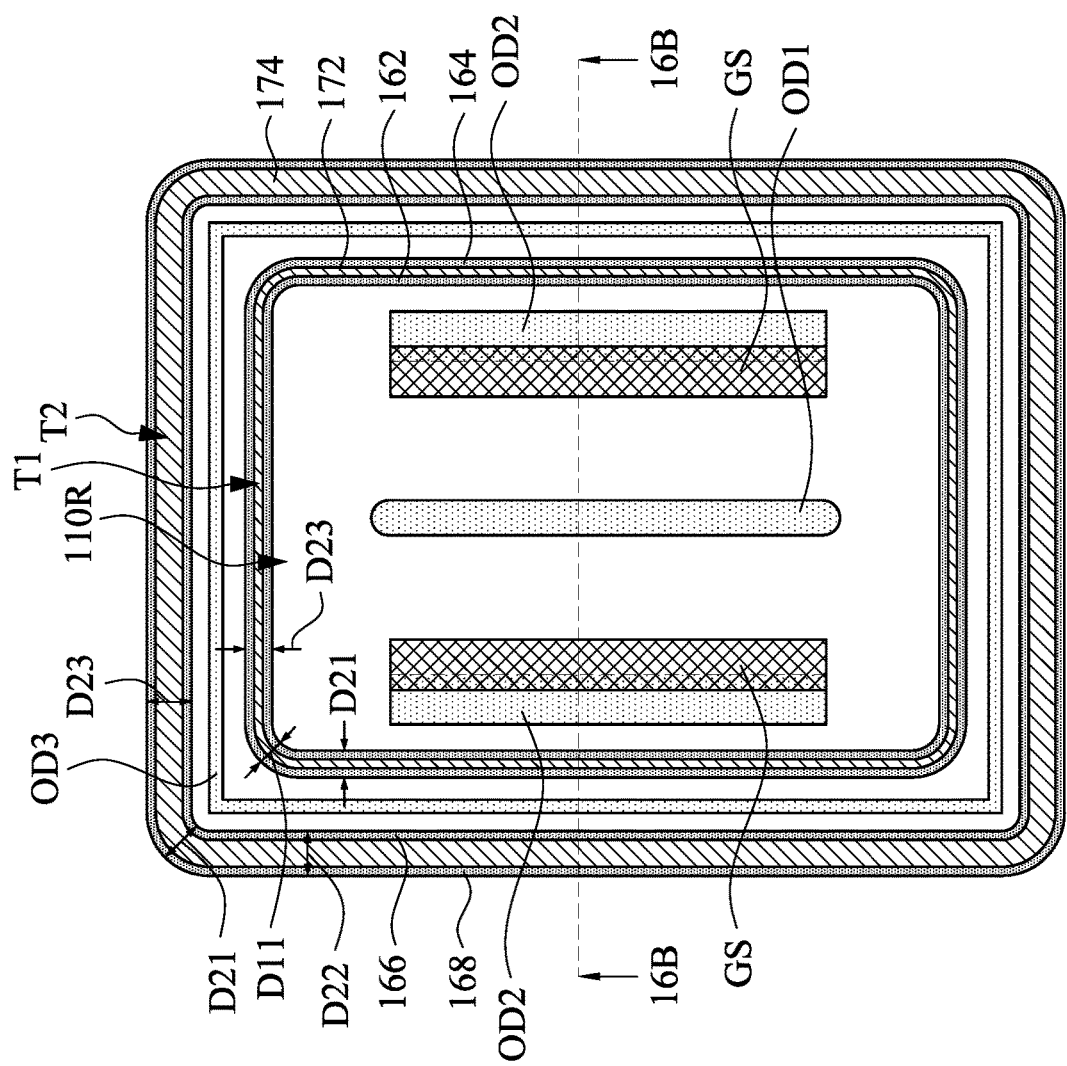
FIG. 16A is a schematic top view of a semiconductor structure according to some embodiments of the present disclosure.
Figure 16B:
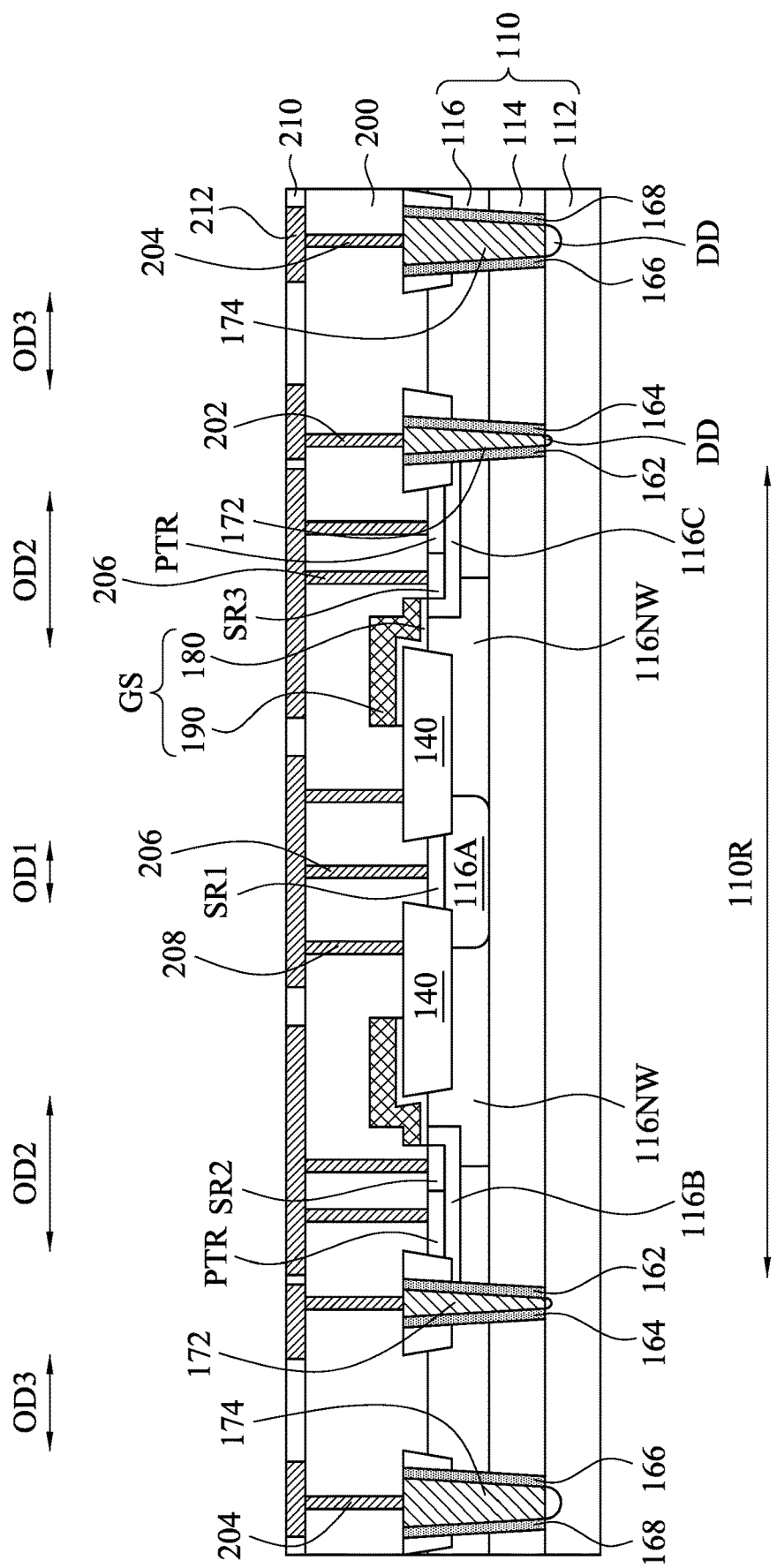
FIG. 16B is a schematic cross-sectional view taken along line 16B-16B in FIG. 16A.

FIG. 16A is a schematic top view of a semiconductor structure according to some embodiments of the present disclosure. FIG. 16B is a schematic cross-sectional view taken along line 16B-16B in FIG. 16A. The present embodiments are similar to those of FIGS. 15A and 15B, and at least one difference between the present embodiments and the embodiments of FIGS. 15A and 15B is that: in the present embodiments, the distances D11-D13 of the trench T1 are smaller than the distances D21-D23 of the trench T2. In some embodiments, the distances D11-D13 of the trench T1 are substantially equal to each other, and the D21-D23 of the trench T2 are substantially equal to each other. Through the configuration, the conductive plug 172 is thinner than the conductive plug 174. Other details of the present embodiments are similar to those aforementioned, and not repeated herein.

Figure 17A:
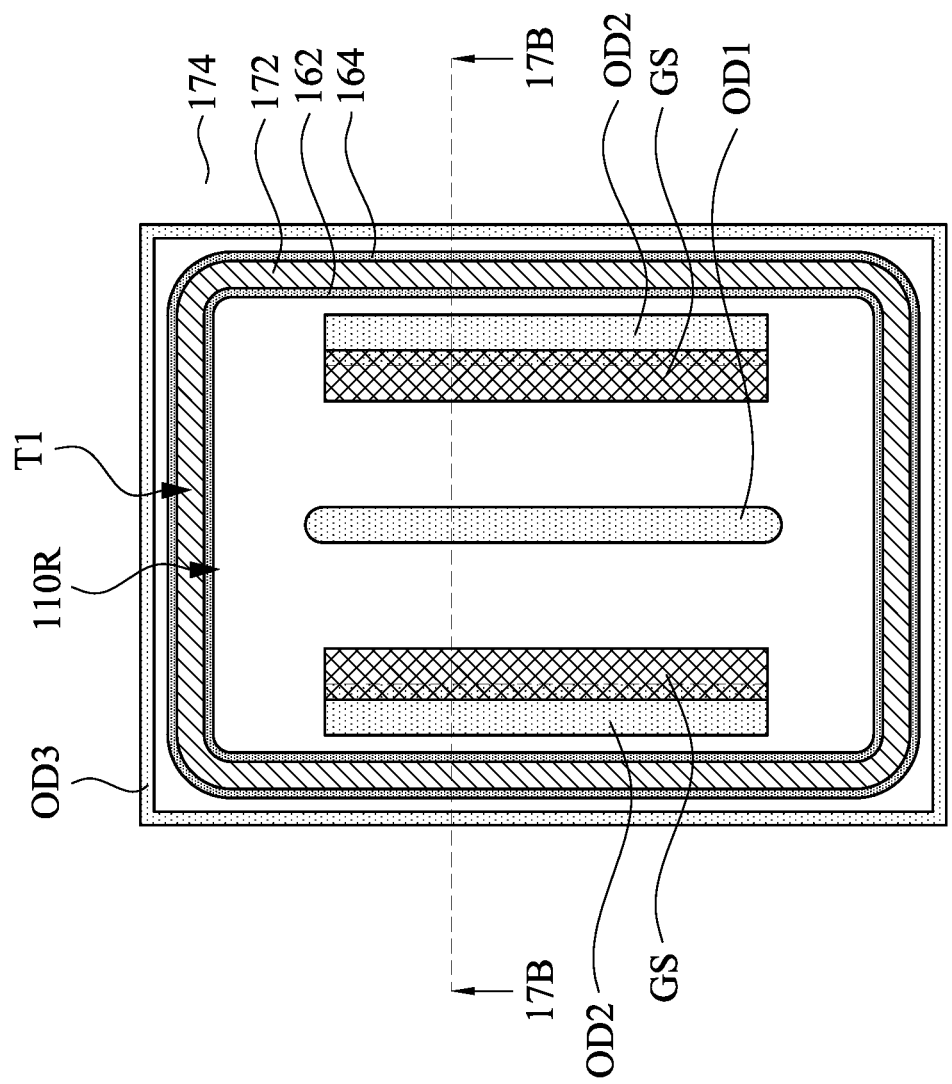
FIG. 17A is a schematic top view of a semiconductor structure according to some embodiments of the present disclosure.
Figure 17B:
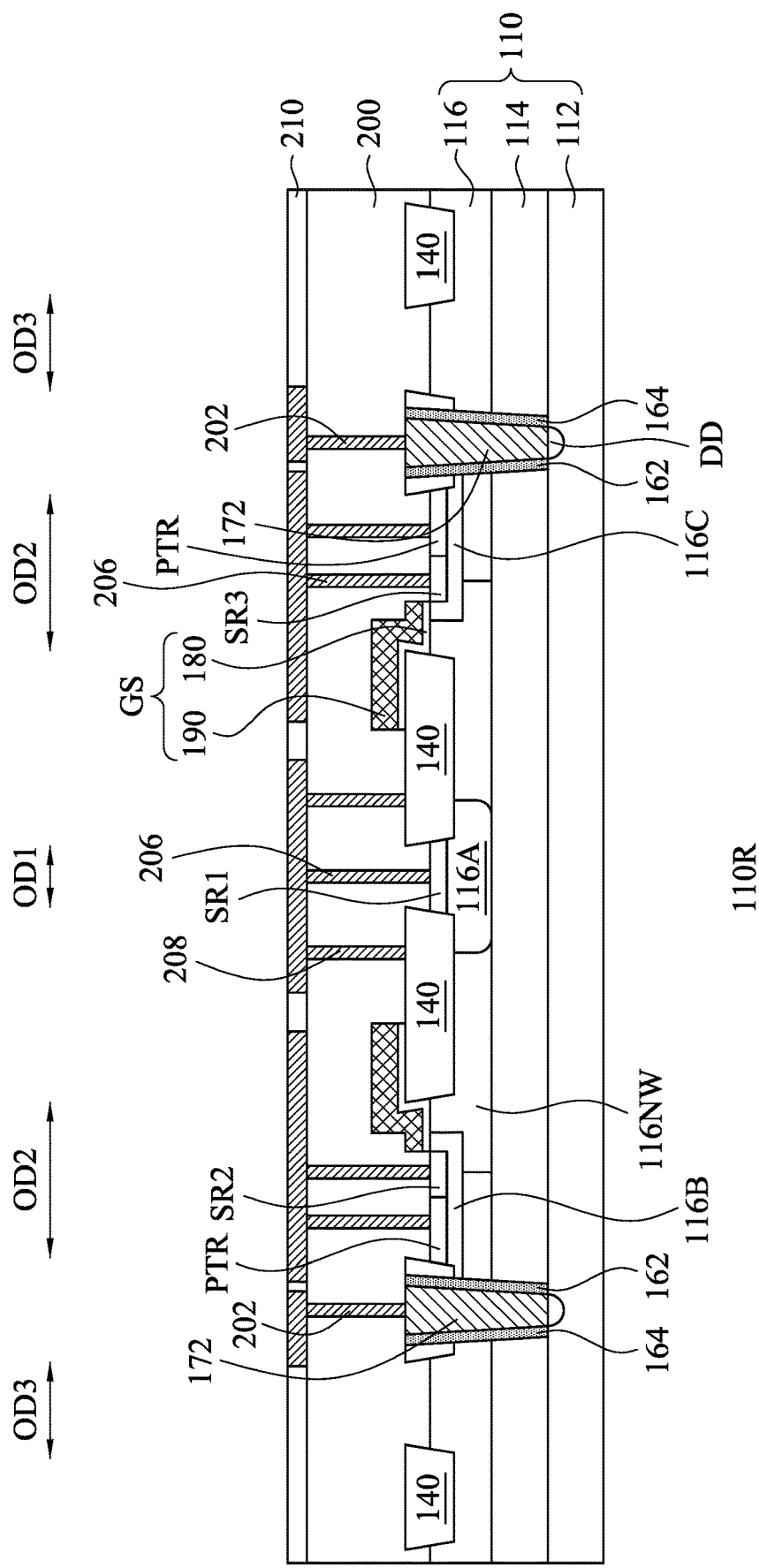
FIG. 17B is a schematic cross-sectional view taken along line 17B-17B in FIG. 17A.

FIG. 17A is a schematic top view of a semiconductor structure according to some embodiments of the present disclosure. FIG. 17B is a schematic cross-sectional view taken along line 17B-17B in FIG. 17A. The present embodiments are similar to those of FIGS. 15A and 15B, and at least one difference between the present embodiments and the embodiments of FIGS. 15A and 15B is that: in the present embodiments, the conductive plug 174 is omitted. In some embodiments, the semiconductor base substrate 112 may be electrically bias by the contact plug 172 surrounding the device region 110R. Other details of the present embodiments are similar to those aforementioned, and not repeated herein.

Figure 18A:
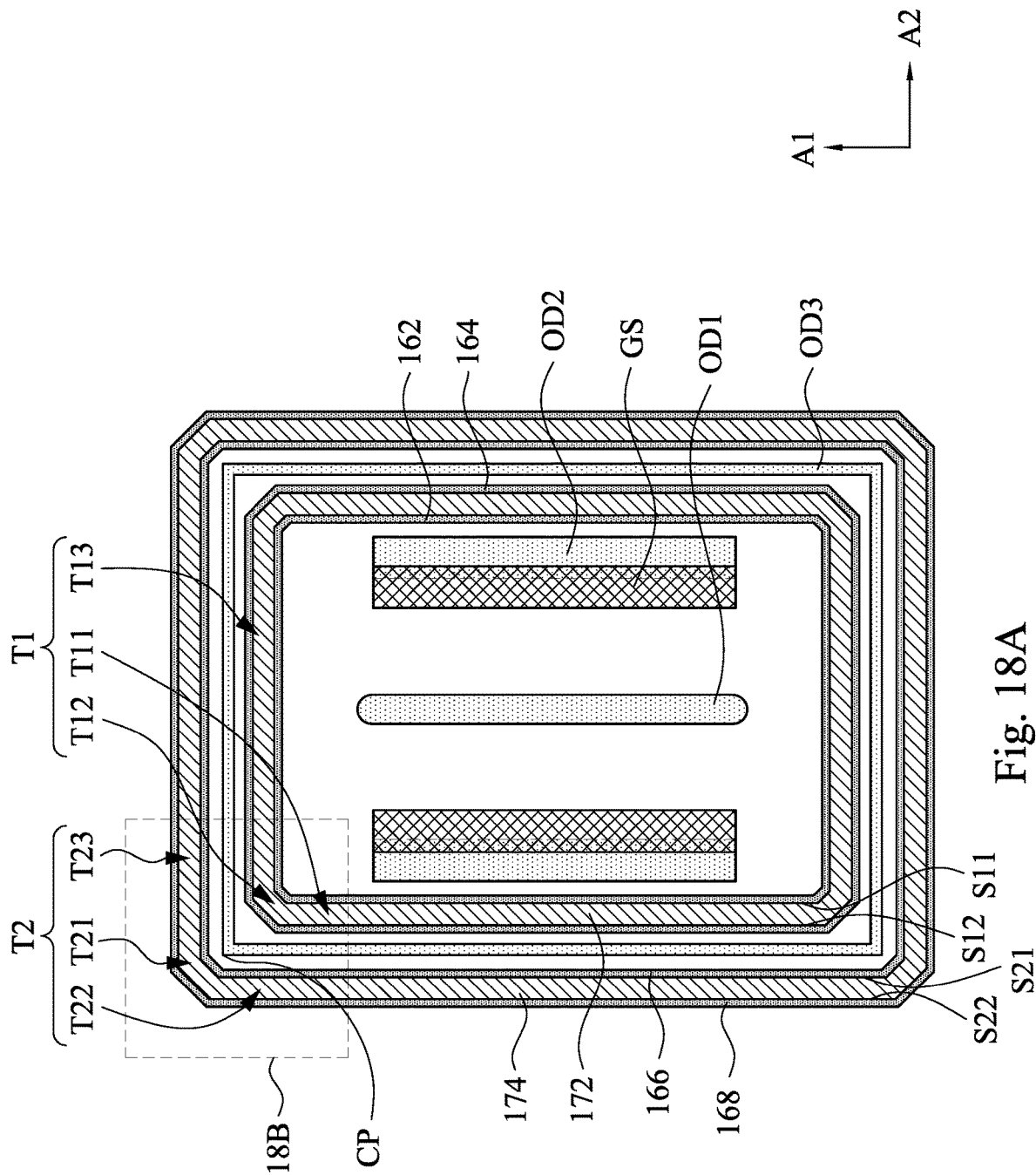
FIG. 18A is a schematic top view of a semiconductor structure according to some embodiments of the present disclosure.
Figure 18B:
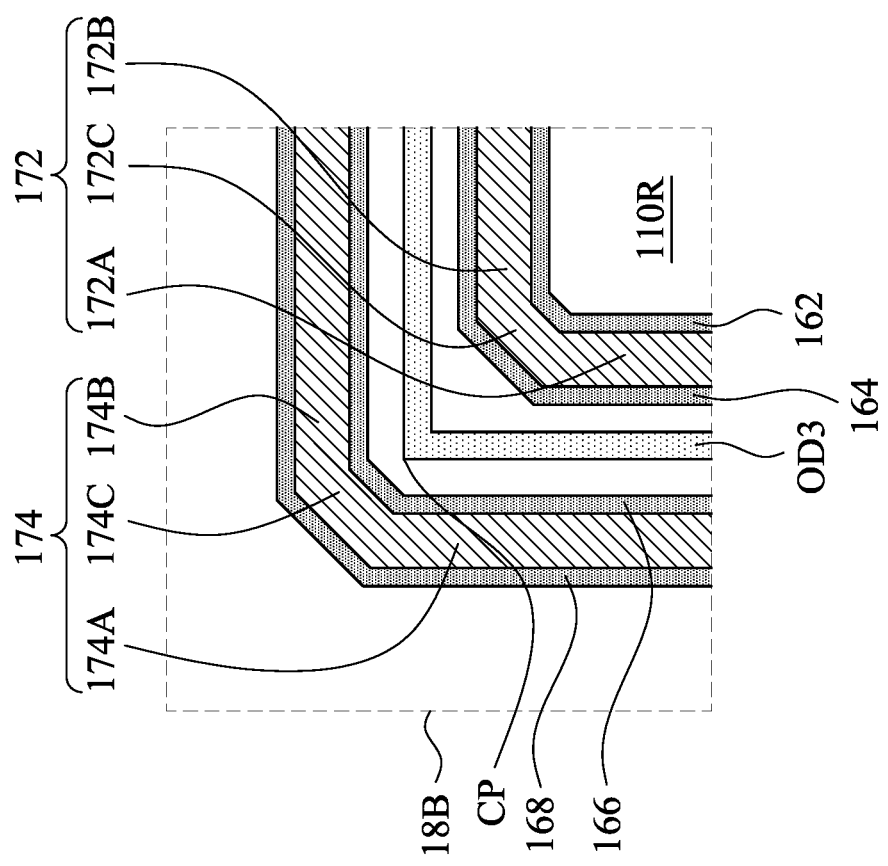
FIG. 18B is an enlarged view of a portion of FIG. 18A.

FIG. 18A is a schematic top view of a semiconductor structure according to some embodiments of the present disclosure. FIG. 18B is an enlarged view of a portion 18B of FIG. 18A. The present embodiments are similar to those of FIGS. 15A and 15B, and at least one difference between the present embodiments and the embodiments of FIGS. 15A and 15B is that: in the present embodiments, the corner portions T11 and T21 of the trenches T1 and T2 are not curved, and the insulating layers 162, 164, 166, 168 and the conductive plugs 172 and 174 at four corners are not curved in accordance with the profile of the trenches T1 and T2. For example, the sidewalls S11, S12, S21, are S22 are straight lines when viewing from top of the semiconductor structure as shown in FIG. 18A. The corner portions 172C and 174C of the conductive plugs 172 and 174 are straight when viewing from top of the semiconductor structure as shown in FIG. 18A. In the present embodiments, a straight sidewall S21 of the corner portion T21 is aligned with respect to the corner point CP of the region OD3 in the directions A1 and A2 as shown in FIG. 18A. In the present embodiments, the distances D11-D13 of the trench T1 are designed to be substantially equal to each other, and the D21-D23 of the trench T2 are designed to be substantially equal to each other. In some other embodiments, the distance D11 of the trench T1 may be less than the distances D12/D13 of the trench T1, and the distance D21 of the trench T2 may be less than the distances D22/D23 of the trench T2. Other details of the present embodiments are similar to those aforementioned, and not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the process window for sidewall oxide etching process is improved, and the sidewall oxide asymmetric issue is solved, which in turn will improve the electrical isolation between the conductive plug and transistor devices. Another advantage is that by designing the trenches with similar width at sides and corners, conductive material may be deposited without void therein, which in turn will enlarge the process window for contact vias connected to the conductive plugs, and thereby preventing the conductive plugs from contact open issue.

According to some embodiments of the present disclosure, a semiconductor structure includes a semiconductor substrate, a transistor, a plurality of isolation structures, and a conductive feature. The transistor is over the semiconductor substrate. The isolation structures are over the semiconductor substrate. The isolation structures define a semiconductor ring of the semiconductor substrate surrounding the transistor. The conductive feature extends vertically in the semiconductor substrate and surrounds the transistor and semiconductor ring. The conductive feature has a rounded corner facing the semiconductor ring from a top view.

According to some embodiments of the present disclosure, a semiconductor structure includes a semiconductor substrate, a transistor, a first conductive feature, and a plurality of isolation structures. The transistor is over the semiconductor substrate. The first conductive feature extends vertically in the semiconductor substrate and surrounds the transistor. The isolation structures are over the semiconductor substrate. The isolation structures define a semiconductor ring of the semiconductor substrate surrounding the transistor and the first conductive feature. The first conductive feature has a first sidewall facing the semiconductor ring, and the first sidewall of the first conductive feature form a rounded corner from a top view.

According to some embodiments of the present disclosure, a semiconductor structure includes a semiconductor base substrate, a buried oxide layer, a semiconductor layer over the semiconductor base substrate, a transistor, a plurality of isolation structures, a conductive feature, and an insulating layer. The transistor is over the semiconductor layer. The isolation structures are over the semiconductor layer. The isolation structures define a semiconductor ring of the semiconductor layer surrounding the transistor. The conductive feature extends through the semiconductor layer and the buried oxide layer and is connected to the semiconductor base substrate. The conductive feature surrounds the transistor. The insulating layer is between the semiconductor layer and the conductive feature. One of the isolation structures has a first sidewall adjoining the semiconductor ring and a second sidewall adjoining the insulating layer, and a corner of the second sidewall is more rounded than a corner of the first sidewall from a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   a transistor over the semiconductor substrate;
   a plurality of isolation structures over the semiconductor substrate, wherein the isolation structures define a semiconductor ring of the semiconductor substrate surrounding the transistor, wherein the semiconductor ring is spaced apart from the transistor by one of the isolation structures; and
   a conductive feature extending vertically in the semiconductor substrate and surrounding the transistor and the semiconductor ring, wherein the conductive feature has a rounded corner facing the semiconductor ring from a top view.

2. The semiconductor structure of claim 1, wherein from the top view the rounded corner of the conductive feature faces a corner of the semiconductor ring, and the rounded corner of the conductive feature is more rounded than the corner of the semiconductor ring.

3. The semiconductor structure of claim 1, wherein from the top view, the semiconductor ring has an angle corner, and the rounded corner of the conductive feature faces the angled corner of the semiconductor ring from the top view.

4. The semiconductor structure of claim 1, wherein a bottom surface of the conductive feature is lower than a bottom surface of the isolation structures.

5. The semiconductor structure of claim 1, further comprising:
   a first insulating layer between the conductive feature and the semiconductor substrate.

6. The semiconductor structure of claim 5, wherein a first portion of the first insulating layer adjacent to the rounded corner of the conductive feature has a first thickness, a second portion of the first insulating layer adjacent to a straight portion of the conductive feature has a second thickness, and the first thickness is substantially equal to the second thickness.

7. The semiconductor structure of claim 1, wherein the conductive feature comprises polysilicon.

8. The semiconductor structure of claim 1, further comprising:
   a doping region in the semiconductor substrate below the conductive feature.

9. A semiconductor structure, comprising:
   a semiconductor substrate;
   a transistor over the semiconductor substrate;
   a first conductive feature extending vertically in the semiconductor substrate and surrounding the transistor; and
   a plurality of isolation structures over the semiconductor substrate, wherein the isolation structures define a semiconductor ring of the semiconductor substrate surrounding the transistor and the first conductive feature, wherein from a top view the semiconductor ring has a ring-shaped pattern non-overlapping with the transistor, wherein the first conductive feature has a first sidewall facing the semiconductor ring, and the first sidewall of the first conductive feature form a first rounded corner from the top view.

10. The semiconductor structure of claim 9, wherein from the top view, the first rounded corner of the first sidewall of the first conductive feature faces a corner of the semiconductor ring, and the first rounded corner of the first sidewall of the first conductive feature is more rounded than the corner of the semiconductor ring.

11. The semiconductor structure of claim 9, further comprising:
   a first insulating layer between the first sidewall of the first conductive feature and the semiconductor substrate; and
   a second insulating layer between a second sidewall of the first conductive feature and the semiconductor substrate, and the second sidewall of the first conductive feature is opposite to the first sidewall of the first conductive feature, and the second sidewall of the first conductive feature form a second rounded corner from the top view.

12. The semiconductor structure of claim 11, wherein a portion of the first insulating layer adjacent to the first rounded corner of the first sidewall of the first conductive feature has a first thickness, a portion of the second insulating layer adjacent to the second rounded corner of the second sidewall of the first conductive feature has a second thickness, and the first thickness is substantially equal to the second thickness.

13. The semiconductor structure of claim 9, wherein the isolation structures surround a top portion of the first conductive feature.

14. The semiconductor structure of claim 9, wherein a top surface of the first conductive feature is higher than a top surface of the semiconductor substrate.

15. The semiconductor structure of claim 9, further comprising a second conductive feature extending vertically in the semiconductor substrate and surrounding the transistor, the first conductive feature, and the semiconductor ring.

16. A semiconductor structure, comprising:
   a semiconductor base substrate;
   a buried oxide layer;
   a semiconductor layer over the semiconductor base substrate;
   a transistor over the semiconductor layer;
   a plurality of isolation structures over the semiconductor layer, wherein the isolation structures define a semiconductor ring of the semiconductor layer surrounding the transistor;
   a conductive feature extending through the semiconductor layer and the buried oxide layer and connected to the semiconductor base substrate, wherein the conductive feature surrounds the transistor, and the conductive feature is surrounded by the semiconductor ring from a top view; and
   an insulating layer between the semiconductor layer and the conductive feature, wherein one of the isolation structures has a first sidewall adjoining the semiconductor ring and a second sidewall adjoining the insulating layer, and a corner of the second sidewall is more rounded than a corner of the first sidewall from the top view.

17. The semiconductor structure of claim 16, wherein the second sidewall of said one of the isolation structures is a portion of a circumference of a circle centered at a point of the corner of the first sidewall of said one of the isolation structures from the top view.

18. The semiconductor structure of claim 17, wherein the second sidewall of said one of the isolation structures is one-fourth of the circumference of the circle from the top view.

19. The semiconductor structure of claim 16, wherein a top surface of the conductive feature, a top end of the insulating layer, and a top surface of the isolation structures are higher than a top surface of the semiconductor layer.

20. The semiconductor structure of claim 16, further comprising:
   a doping region in the semiconductor base substrate below the conductive feature.

* * * * *